(12) United States Patent
Paneccasio, Jr. et al.

(10) Patent No.: US 10,519,557 B2
(45) Date of Patent: Dec. 31, 2019

(54) LEVELER COMPOSITIONS FOR USE IN COPPER DEPOSITION IN MANUFACTURE OF MICROELECTRONICS

(71) Applicant: MacDermid Enthone Inc., Waterbury, CT (US)

(72) Inventors: Vincent Paneccasio, Jr., Waterbury, CT (US); Kyle Whitten, Waterbury, CT (US); Thomas B. Richardson, Waterbury, CT (US); Ivan Li, Waterbury, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 221 days.

(21) Appl. No.: 15/412,809

(22) Filed: Jan. 23, 2017

(65) Prior Publication Data
US 2017/0233883 A1    Aug. 17, 2017

Related U.S. Application Data

(60) Provisional application No. 62/294,643, filed on Feb. 12, 2016.

(51) Int. Cl.
*C25D 3/38* (2006.01)
*C08G 65/333* (2006.01)
(Continued)

(52) U.S. Cl.
CPC ......... *C25D 3/38* (2013.01); *C08G 65/33396* (2013.01); *C25D 7/12* (2013.01);
(Continued)

(58) Field of Classification Search
CPC .. C25D 3/38; C25D 7/123; C25D 7/12; C08L 71/03; C08G 65/24; C08G 65/33396;
(Continued)

(56) References Cited

U.S. PATENT DOCUMENTS

| 4,038,161 A * | 7/1977 | Eckles ..................... C25D 3/38 205/297 |
| 4,336,114 A | 6/1982 | Mayer et al. |

(Continued)

FOREIGN PATENT DOCUMENTS

| JP | 61-41787 | 2/1986 |
| JP | 2011-207878 | 10/2011 |

*Primary Examiner* — Louis J Rufo
(74) *Attorney, Agent, or Firm* — Carmody Torrance Sandak & Hennessey LLP

(57) ABSTRACT

An aqueous electrolytic composition and a process for electrodeposition of copper on a dielectric or semiconductor base structure using the aqueous electrolytic composition. The process includes (i) contacting a metalizing substrate comprising a seminal conductive layer on the base structure with an aqueous electrolytic deposition composition; and (ii) supplying electrical current to the electrolytic deposition composition to deposit copper on the substrate. The aqueous electrolytic composition comprises: (a) copper ions; (b) an acid; (c) a suppressor; and (d) a quaternized poly(epihalohydrin) comprising n repeating units corresponding to structure 1N and p repeating units corresponding to structure 1P:

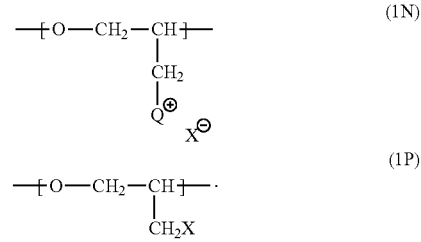

28 Claims, 6 Drawing Sheets

(51) Int. Cl.
- *H05K 3/18* (2006.01)
- *H05K 3/42* (2006.01)
- *C25D 7/12* (2006.01)
- *C08G 65/24* (2006.01)
- *C08L 71/03* (2006.01)
- *H01L 21/768* (2006.01)
- *H01L 21/48* (2006.01)
- *H01L 21/288* (2006.01)

(52) U.S. Cl.
CPC .............. *H05K 3/188* (2013.01); *H05K 3/424* (2013.01); *H01L 21/486* (2013.01); *H01L 21/76898* (2013.01); *H05K 2203/0723* (2013.01)

(58) Field of Classification Search
CPC ...... H05K 3/188; H05K 3/424; H01L 21/288; H01L 21/76898; H01L 21/486
See application file for complete search history.

(56) References Cited

U.S. PATENT DOCUMENTS

| | | | |
|---|---|---|---|
| 4,555,315 A * | 11/1985 | Barbieri | C25D 3/38 205/296 |
| 6,183,622 B1 * | 2/2001 | Janik | C25C 1/12 205/296 |
| 6,676,823 B1 | 1/2004 | Bokisa | |
| 7,303,992 B2 | 12/2007 | Paneccasio et al. | |
| 7,777,078 B2 | 8/2010 | Kumagai et al. | |
| 8,268,157 B2 | 9/2012 | Niazimbetova | |
| 2003/0111349 A1 * | 6/2003 | Sierakowski | C25C 1/00 205/67 |
| 2004/0249177 A1 * | 12/2004 | Wang | C25D 3/38 549/563 |
| 2005/0092611 A1 * | 5/2005 | Kim | C25D 3/38 205/123 |
| 2006/0062753 A1 | 3/2006 | Naraghi et al. | |
| 2006/0166032 A1 | 7/2006 | Kumagai | |
| 2012/0043654 A1 * | 2/2012 | Lu | C25D 5/10 257/737 |
| 2014/0120722 A1 | 5/2014 | Richardson et al. | |
| 2017/0183791 A1 * | 6/2017 | Sun | C25D 3/38 |

* cited by examiner

LEVELER COMPOSITIONS FOR USE IN COPPER DEPOSITION IN MANUFACTURE OF MICROELECTRONICS

FIELD OF THE INVENTION

This disclosure relates to electrodeposition of copper in the manufacture of electronic circuits, and more particularly to synthesis of levelers, and the use of levelers and plating bath formulations in forming copper deposits over dielectric and semiconductor base structures.

BACKGROUND OF THE INVENTION

The function of levelers in the electrodeposition of copper varies with the object of deposition. In the Damascene process for filling submicron features of semiconductor integrated circuit devices, levelers, accelerators and/or suppressors are combined in appropriate concentrations in the plating bath to promote bottom-up filling of such features. In such applications, the function of the additives is to establish a vertical polarization gradient along the wall of a via or trench which enhances the current density at the bottom relative to the current density in the upper reaches of the wall and on the field.

Levelers also find application in electrodeposition compositions for filling so-called through silicon vias (TSVs) which are very small on an absolute scale, but far larger than the submicron features that are filled in the Damascene process.

Levelers are also used in electrolytic solutions for plating copper onto printed circuit boards, including the walls of through holes in the board. In such applications, levelers function to enhance throwing power in conformal plating of the walls and surrounding field.

As described in U.S. Pat. No. 4,336,114 to Mayer et al., the subject matter of which is herein incorporated by reference in its entirety, poly(epichlorohydrin) quaternized by reaction with trimethylamine or triethylamine has been used in combination with a phthalocyanine, an organic divalent sulfur compound, and an alkylated polyethylenimine in aqueous compositions for the electrodeposition of copper to produce copper deposits that are said to be bright, ductile, and level with good recess brightness on metal substrates, particularly printed circuit boards, over a wide range of bath concentrations and operating current densities. The brightening and leveling systems are particularly applicable for copper plating of electronic circuitry printed circuit boards in achieving bright, level, ductile deposits which provide level deposits over imperfections in the apertures of such printed circuitry boards.

U.S. Pat. No. 4,555,315 to Barbieri et al., the subject matter of which is herein incorporated by reference in its entirety, describes a similar process using a plating bath comprising a bath soluble polyether compound, a bath soluble organic divalent sulfur compound, a bath soluble adduct of a tertiary alkyl amine with poly(epichlorohydrin), and a bath soluble reaction product of polyethyleneimine and an alkylating agent.

U.S. Pat. No. 6,183,622 to Janik, the subject matter of which is herein incorporated by reference in its entirety, describes the use of poly(epichlorohydrin) trimethylamine quaternary additives that enhances the ductility of copper deposited in electrorefining or electrowinning.

U.S. Pat. No. 6,676,823 to Bokisa, the subject matter of which is herein incorporated by reference in its entirety, describes the use of an adduct of alkylamine and poly (epichlorohydrin) as a brightener in acid copper plating, including high speed plating using relatively high current densities. A list of applications includes plating integrated circuits and through holes of circuit boards.

U.S. Pat. No. 7,777,078 to Kumagai et al., the subject matter of which is herein incorporated by reference in its entirety, describes a process for plating copper foil onto a cathode drum. The plating bath may contain poly(epichlorohydrin) quaternary amine salts. Quaternizing amines include trimethylamine and triethylamine.

U.S. Pat. Pub. No. 2006/0062753 to Naraghi, the subject mater of which is herein incorporated by reference in its entirety, describes the use of poly(quaternary ammonium) salts as biodegradable corrosion inhibitors for metal surfaces, and as biocides. Exemplary tertiary amines which may be quaternized by reaction with poly(epichlorohydrin) include hexadecyl-dimethylamine, tetradecyldimethylamine, dodecyldimethylamine, imidazoline, and alkyl pyridines. Epichlorohydrin is polymerized in the presence of a polyol, resulting in binding of the poly(epichlorohydrin) through ether linkages to the polyol residue. Epichlorohydrin repeating units of the polymer are then reacted with the tertiary amine to produce quaternary ammonium pendent groups.

SUMMARY OF THE INVENTION

The present invention relates generally to electrolytic plating baths and plating processes in which the bath contains a quaternized poly(epihalohydrin). In various embodiments of the plating processes, copper is deposited on a metalizing substrate comprising a seminal conductive layer that has been initially formed or deposited on a dielectric or semiconductor base structure. The seminal conductive layer is contacted with an aqueous electrolytic deposition composition, and electrical current is supplied to the electrolytic deposition composition to deposit copper on the substrate. In these embodiments, the aqueous electrolytic solution comprises copper ions, an acid, a suppressor, and a quaternized poly(epihalohydrin) comprising n repeating units corresponding to structure 1N and p repeating units corresponding to structure 1P:

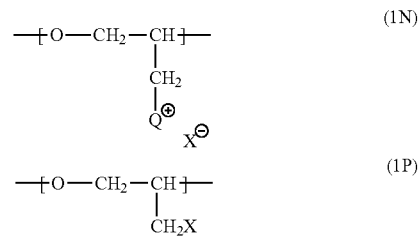

wherein Q has a structure corresponding to that which may be obtained by reacting a pendent methylene halide group of poly(epihalohydrin) with a tertiary amine selected from the group consisting of: (i) $NR^1R^2R^3$ wherein each of $R^1$, $R^2$ and $R^3$ is independently selected from the group consisting of substituted or unsubstituted alkyl, alicyclic, aralkyl, substituted or unsubstituted alkenyl, substituted or unsubstituted alkynyl, aryl and heterocyclic; (ii) an N-substituted and optionally further substituted heteroalicyclic amine wherein the N-substituent is selected from the group consisting of substituted or unsubstituted alkyl, alicyclic, aralkyl, aryl, and heterocyclic; and (iii) a substituted or unsubstituted nitrogen-containing heteroaryl compound; n is an integer between 3 and 35, p is an integer between 0 and 25; X is a halo substituent; and X⁻ is a monovalent anion, ordinarily a halide ion. Where any of $R^1$, $R^2$ and $R^3$ is substituted, the substituent preferably does not comprise an amino group.

The structure and properties of the quaternized poly(epichlorohydrin) are compatible with other components of the electrolytic composition, especially with respect to solubility in the overall composition. Compatibility is a function of various structural parameters, including the extent of quaternization, the presence or absence of repeating units other than 1N and 1P, and molecular weight. By "compatible" what is meant is that the quaternized poly(epihalohydrin) is capable of forming a homogeneous mixture with the overall composition that neither separates nor is altered by chemical interaction with the overall composition. By selection of the molecular weight of the core PECH, the amine for the quaternization reaction, the extent of quaternization, the optional use of co-monomers in polymerizing epihalohydrin, the identity of any co-monomers, and fraction of co-monomers, the composition can be tailored to assure compatibility while imparting the properties that may be optimal for a particular application. Preferred structural features are further discussed herein.

In certain embodiments, the electrolytic solution further comprises an accelerator. The sequence of repeating units in the quaternized poly(epihalohydrin) can be arranged in random, block, alternating or other configuration.

The plating baths and plating processes described herein can be used in various applications, including Damascene plating of integrated circuits, filling submicron vias and trenches in dielectric base structure such as the silicon dioxide insulating layer on a silicon wafer or chip, filling through silicon vias, and plating through holes and/or blind microvias in printed circuit boards. Compositions containing quaternized poly(epihalohydrin) ("QPECH") or quaternized poly(epichlorohydrin) (QPECH) levelers can be formulated so that the same particular composition can be used for several different applications, including conformally plating printed circuit boards, filling through holes, and filling blind microvias. In particularly preferred embodiments of the process, electrodeposition can be conducted simultaneously in a process wherein printed circuit boards, including through holes therein, through silicon vias, and/or microvias are simultaneously in contact with a single electrodeposition composition, e.g., as components of an electronic product assembly that is immersed in the same electrodeposition bath to which current is supplied. Without limitation, other applications of the process include, e.g., wafer level packaging and forming bumps and pillars in integrated circuit packaging.

In various preferred embodiments, quaternization of poly(epihalohydrin) is advantageously conducted in a high boiling polar solvent medium. The reaction product in the polar medium can be directly combined with other components in preparing electrodeposition compositions for use in the novel process.

DETAILED DESCRIPTION OF PREFERRED EMBODIMENTS

Figure 1:
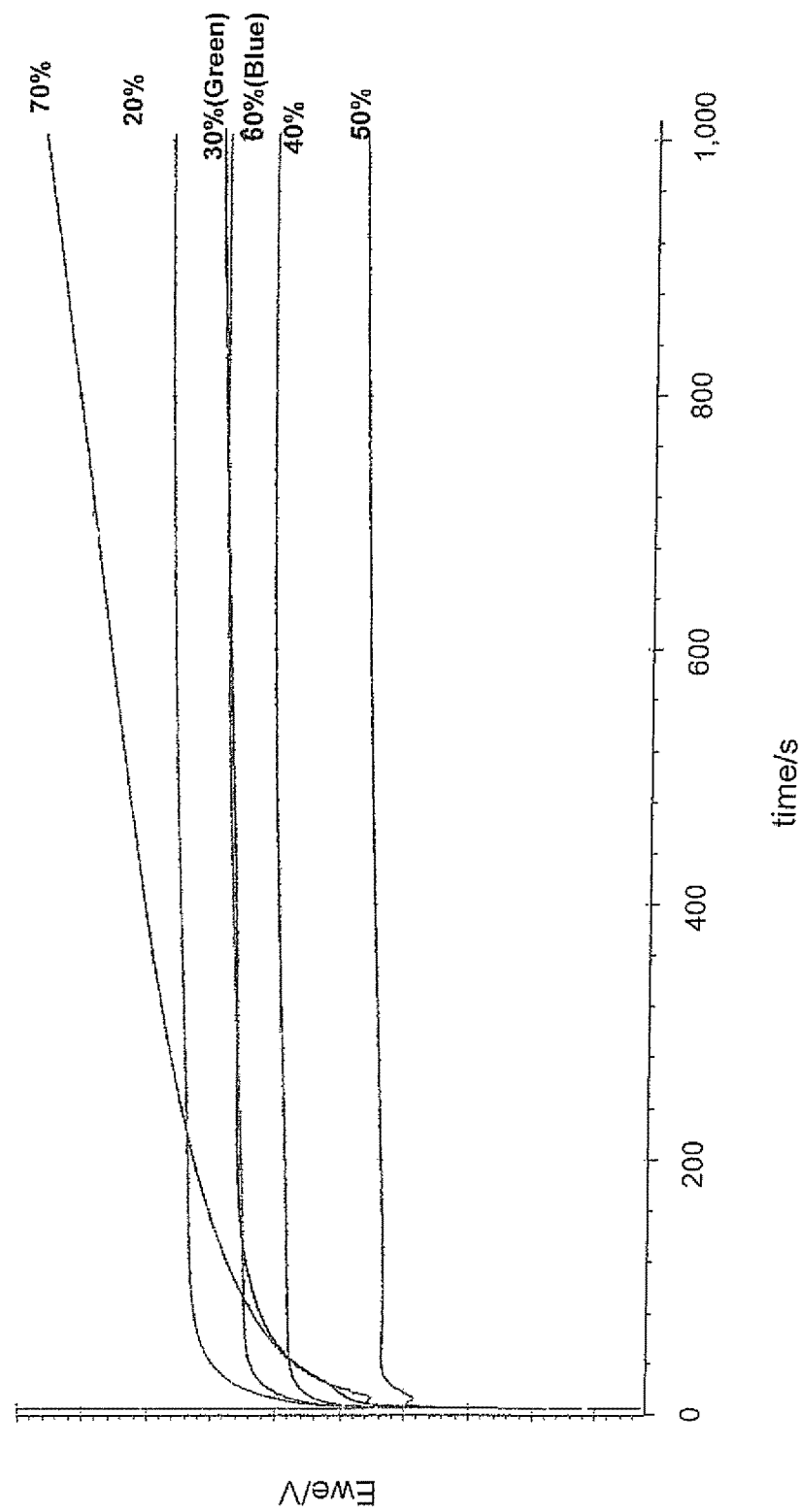
FIG. 1 depicts chronopotentiometry curves obtained in polarization tests of a series of electrodeposition solutions containing levelers prepared by quaternization of poly(epichlorohydrin) by reaction with varying proportions of 3-hydroxypropyldimethylamine.

As described herein, the present invention relates generally to electrolytic plating baths and plating processes in which the bath contains a quaternized poly(epihalohydrin).

In one embodiment, the present invention comprises a process for electrodeposition of copper on a dielectric or semiconductor base structure, the method comprising:

contacting a metalizing substrate comprising a seminal conductive layer on the base structure with an aqueous electrolytic deposition composition; and supplying electrical current to the electrolytic deposition composition to deposit copper on the substrate.

In one embodiment, the aqueous electrolytic composition comprises:
copper ions;
an acid;
a suppressor; and
a quaternized poly(epihalohydrin) comprising n repeating units corresponding to structure 1N and p repeating units corresponding to structure 1P:

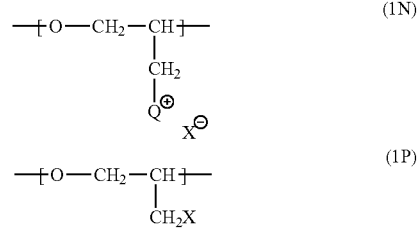

wherein Q has a structure corresponding to that which may be obtained by reacting a pendent methylene halide group of poly(epihalohydrin) with a tertiary amine selected from the group consisting of: (i) $NR^1R^2R^3$ wherein each of $R^1$, $R^2$ and $R^3$ is independently selected from the group consisting of substituted or unsubstituted alkyl, substituted or unsubstituted alkenyl, substituted or unsubstituted alkynyl, substituted or unsubstituted alicyclic, substituted or unsubstituted aralkyl, substituted or unsubstituted aryl and substituted or unsubstituted heterocyclic; (ii) an N-substituted and optionally further substituted heteroalicyclic amine wherein the N-substituent is selected from the group consisting of substituted or unsubstituted alkyl, substituted or unsubstituted alicyclic, substituted or unsubstituted aralkyl, substituted or unsubstituted aryl, and substituted or unsubstituted heterocyclic; and (iii) a substituted or unsubstituted nitrogen-containing heteroaryl compound;

n is an integer between 3 and 35, p is an integer between 0 and 25;

X is a halo substituent; and

X⁻ is a monovalent anion.

In some embodiments, the aqueous electrolytic composition comprises a polar organic solvent characterized by a boiling point (neat) of at least 120° C.

In one embodiment, the quaternized poly(epihalohydrin) repeating units and non-quaternized epihalohydrin repeating units in said quaternized poly(epihalohydrin) are arranged in a block, alternating or random configuration.

The inventors of the present invention have discovered that a range of quaternized poly(epihalohydrin)s enhance the properties of electrolytic copper plating baths and processes for the deposition of copper in a variety of applications. For example, the quaternized poly(epihalohydrin)s are advantageously used in filling concavities in semiconductor base structures, most particularly, through silicon vias or other vias having an entry dimension between about 60 and about 190 μm and depth between about 40 and about 150 μm or between about 60 and 100 μm.

The quaternized poly(epihalohydrin)s can also be used as levelers in a Damascene plating process for filling submicron vias or trenches in an insulating layer on a semiconductor wafer or chip having, e.g., an entry dimension not greater than about 500 nm, more typically less than about 200 nm, still more typically less than about 100 nm and having an aspect ratio of at least 3:1, more commonly between about 4:1 and about 10:1. The levelers are effective in a process for filling features of such aspect ratio in a semiconductor base structure that have an entry dimension less than 50 nm or even less than 30 nm. For example, a submicron feature may have an entry dimension between 5 nm and 100 nm, or between 5 nm and 50 nm, or between 5 nm and 30 nm, or between 10 nm and 50 nm, or between 10 and 30 nm.

Because copper deposited in submicron features via the Damascene process tends to have high impurity levels, the value of the novel levelers is more fully realized in other applications, including, for example, filling through silicon vias and plating over the dielectric surfaces of printed circuit boards. The novel levelers of the invention promote high throwing power, producing uniform film thickness in conformal plating over the walls of through holes in a printed circuit board and in the field, i.e., over all or part of the face of the dielectric base structure surrounding the through hole. The process is also effective for conformal plating over the so-called "knee," i.e., the contour of the transition at the corner of the trench or via between the face and the through hole wall, at a copper thickness substantially the same as the thickness of the copper deposit on the wall and face.

In addition to plating over the walls of through holes in a printed circuit board, filling through silicon vias (TSVs), filling blind microvias having the dimension characteristic of TSVs, and filling submicron features in the insulating layer on a semiconductor chip or wafer, the plating baths described herein are also useful in electrolytic processes for building copper bumps and pillars in flip chip processes or other processes for packaging integrated circuits.

Preferably Q corresponds to structure IIA, IIB or IIC:

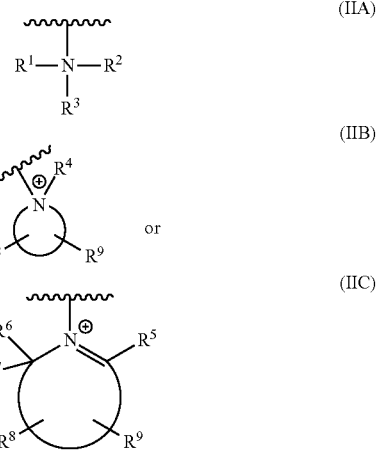

wherein: (i) structure IIB is an N-substituted heterocyclic moiety; (ii) structure IIC is a heterocyclic moiety; (iii) each of $R^1$, $R^2$, $R^3$ and $R^4$ is independently selected from the group consisting of substituted or unsubstituted alkyl, substituted or unsubstituted alkenyl, substituted or unsubstituted alkynyl, substituted or unsubstituted aralkyl, substituted or unsubstituted alicyclic, substituted or unsubstituted aryl, and substituted or unsubstituted heterocyclic; and (iv) each of $R^5$, $R^6$, $R^7$, $R^8$ and $R^9$ is independently selected from the group consisting of hydrogen, substituted or unsubstituted alkyl, substituted or unsubstituted alkenyl, substituted or unsubstituted alkynyl, substituted or unsubstituted aralkyl, substituted or unsubstituted alicyclic, substituted or unsubstituted aryl, and substituted or unsubstituted heterocyclic. Where any of $R^1$ to $R^8$ is substituted, the substituent preferably does not comprise an amino group.

In preferred embodiments of the electrodeposition composition used in the electrodeposition process, Q in structure I corresponds to that which may be obtained by reacting a pendent methylene halide group of poly(epihalohydrin) with a tertiary amine selected from the group consisting of trimethylamine, trimethylamine, N-methylmorpholine, imidazole, 1-methylimidazole, 1-benzylimidazole, 2-imidazoline, 3-imidazoline, and $NR_1R_2R_3$ wherein one of $R_1$, $R_2$ and $R_3$ is selected from the group consisting of unsubstituted alkyl having at least three carbon atoms, hydroxyalkyl, dihydroxyalkyl, benzyl, hydroxyphenylmethyl and dihydroxyphenylmethyl, and each of the others of, $R_1$, $R_2$ and $R_3$ is independently selected from lower alkyl having between 1 and 3 carbon atoms.

Q preferably corresponds to the structure which may be obtained from reacting a pendent methylene halide group with a tertiary amine selected from the group consisting of 3-hydroxypropyldimethylamine, n-butyldimethylamine, di(3-hydroxypropyl)methylamine, 2,3-dihydroxypropyldimethylamine, 3-hydroxypropyldiethylamine, 2-hydroxypropyldimethylamine, 4-hydroxybutyldimethylamine, 2-hydroxyethyldimethylamine, n-propyldimethylamine, 2-hydroxyethoxyethyldimethylamine, di(2-hydroxyethyl)methylamine, benzyldimethylamine, and 4-hydroxybenzyldimethyleamine.

Particularly useful tertiary amines subject to quaternization comprise N,N-dimethylalkanol amines such as 3-dimethylamine-1-propanol, 3-hydroxypropyl dimethylamine, and 2-dimethylamino-1-ethanol. Other preferred tertiary amines include n-butyl dimethylamine, and N,N-dimethylbenzylamine, 4-ethylpyridine, and 1-methylimidazole, 1-benzylimidazole, N-methylmorpholine, and particularly 2-[2-(dimethylamino)ethoxy]ethanol.

In one preferred embodiment, Q corresponds to structure IIA, and one of $R^1$, $R^2$ and $R^3$ is selected from the group consisting of unsubstituted alkyl having at least three carbon atoms, hydroxyalkyl, dihydroxyalkyl, phenyl, hydroxyphenyl, dihydroxyphenyl, benzyl, hydroxyphenylmethyl and dihydroxyphenylmethyl, and each of the others of $R^1$, $R^2$ and $R^3$ is independently selected from lower alkyl having between 1 and 3 carbon atoms.

In another embodiment, Q may be selected from the group consisting of 3-hydroxypropyldimethylamino, n-butyldimethylamino, di(3-hydroxypropyl)methylamino, 2,3-dihydroxypropyldimethylamino, 3-hydroxypropyldiethylamino, 2-hydroxypropyldimethylamino, 4-hydroxybutyldimethylamino, 2-hydroxyethyldimethylamino, n-propyldimethylamino, 2-hydroxyethoxyethyldimethylamino, di(2-hydroxyethyl)methylamino, benzyldimethylamino and 4-hydroxybenzyldimethylamino.

In addition to quaternized epihalohydrin and unquaternized epihalohydrin, the backbone of the QPEHH or QPECH polymer where the epihalohydrin is epichlorohydrin) may optionally include repeating units that are residues of one or more alkylene oxides such as ethylene oxide, propylene oxide, butylene oxide, 3,4-epoxy-1-butanol, 2,3-epoxy-1-propanol, glycidol, and combinations of the foregoing. Polymers of this structure may be prepared by co-polymerizing one or more alkylene oxides and ephihalohydrin, followed by quaternization of epihalohydrin repeating units. The distribution of epihalohydrin units and alkylene oxide units in the backbone may be random, block, or other pattern. Where plural alkylene oxides are used in the polymerization, the backbone comprises repeating units that are residues of more than one alkylene oxide.

For convenience and familiarity of nomenclature, the description of the electrodeposition composition and method hereinafter will refer to "QPECH" levelers. However, it will be understood that, unless otherwise stated, the description encompasses polymers derived from other epihalohydrins, including principally epibromohydrin. The use of epichlorohydrin is highly preferred.

Where the number of alkylene oxide units in the QPECH backbone is q, the ratio of q/n+p+q is preferably not greater than 0.05 in those embodiments where the properties provided by presence of alkylene oxide repeat units is not needed; and typically between about 0.05 and about 0.50, more typically between about 0.10 and about 0.40 where their presence is warrented. In certain preferred embodiments, q is essentially zero and the QPECH consists essentially of repeating units that are residues of epihalohydrin and repeating units that are residues of quaternized epihalohydrin. In such embodiments, the poly(epihalohydrin) may be depicted by the structure:

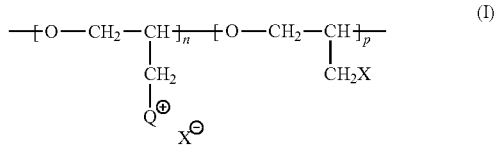

(I)

where Q is as described above.

Regardless of the presence or absence of alkylene oxide repeat units and regardless of the value of q, the ratio of n/n+p can have a bearing on the relative efficacy of the leveler. In certain embodiments wherein there are polar substituents on the quaternized tertiary amine, e.g., 3-hydroxypropyl dimethylamine, the ratio of n/n+p is preferably at least 0.40 and more preferably between about 0.40 and about 0.60. These preferences may also apply where the quaternized tertiary amine contains aryl or aralkyl groups. In other embodiments wherein the tertiary amine is more hydrophobic, e.g., n-butyl dimethylamine, the value of n/n+p is preferably at least about 0.70, e.g., between about 0.70 and 1.0, more preferably at least about 0.75, still more preferably at least about 0.80, e.g., between about 0.80 and 0.95, and most preferably in the range of about 0.90.

Where the poly(epichlorohydrin) contains alkylene oxide units, and there are polar substituent on the quaternary nitrogen. and q/n+p+q is at least 0.05, n/n+p+q is preferably at least 0.20, or between about 0.40 and about 0.60. Where the substituents on the quaternary nitrogen are hydrophobic e.g., where they are all hydrocarbyl groups, n/n+p+q is preferably between about 0.60 and about 0.95, more preferably between about 0.70 and about 0.9, most preferably between 0.75 and 0.90.

Regardless of whether the repeating units include alkylene oxide residues, the chain of repeating units of the polymer may optionally be bonded to a residual oxygen of an alcohol. For example, plural QPECH chains can be bonded to residual oxygens of a monomeric polyol as described in U.S. Pat. Pub. No. 2006/0062753 to Naraghi, the subject matter of which is herein incorporated by reference in its entirety. The preparation of such compositions comprises polymerization of epihalohydrin and condensation of the polymer with the hydroxyl groups of glycerin, as catalyzed, for example, by boron trifluoride. Once the PECH/polyol adduct is formed, epihalohdrin repeating units can be quaternized with an appropriate tertiary amine.

Average molecular weight of the QPECH may vary significantly depending in part on the molecular weight of the amine to be quaternized, the fraction of repeating units that comprise quaternary ammonium groups, and the extent to which the polymer backbone comprises repeating units derived from a co-monomer such as an alkylene oxide. These structural features combine to enhance the polarization imparted by the QPECH while preserving compatibility of the compound with the electrolytic solution, thus achieving a favorable relationship between efficacy and solubility of the QPECH in the solution. Generally, solubility varies inversely with molecular weight while the extent of quaternization enhances solubility at a given molecular weight. The PECH with which the tertiary amine is reacted may have a weight average molecular weight that ranges, for example, between 300 and 4,000 but is preferably in the range of 1,700 to 2,200. After reaction of the PECH or ECH/alkylene oxide copolymer with the tertiary amine, the weight average molecular weight of the quaternized polymer may typically range from 500 and about 10,000, or even higher depending on the overall structure of the QPECH and the overall composition of the electrodeposition bath, more preferably between 800 and about 6,000, or between about 1,200 and about 3,000, or still more preferably between about 2,500 and about 4,000.

The plating composition used in the electrodeposition process typically comprises: a cupric salt such as $CuSO_4$ in a copper ion concentration between about 5 and about 80 g/l, an acid, which may be selected from the group consisting of sulfuric acid, an alkanesulfonic acid, in a concentration between about 5 to about 140 g/L, more preferably between about 10 and about 80 g/L; optionally, a suppressor in a concentration of up to about 4,000 mg/L, more preferably between about 50 and about 4,000 mg/L, optionally, an accelerator in a concentration of between about 1 and about 100 mg/L, and chloride ion in a concentration between about 30 and about 70 ppm. The QPECH polymer is preferably present in a concentration between about 1 and about 100 mg/l, more preferably between about 5 and about 30 mg/l.

Conventional suppressors such as polyalkylene glycols and polyalkoxylated alcohols may be used in the compositions described herein. These are particularly preferred for conformal plating of the through holes of printed circuit boards. Another class of suppressors that may be used together with the novel QPECH levelers in filling TSVs, as well as in Damascene processes, comprise a polyoxyalkylene moiety bonded to a nitrogen of a nitrogen-containing species, the polyoxyalkylene moiety comprising a combination of propylene oxide (PO) and ethylene oxide (EO) repeat units in a PO:EO ratio between 2:8 and 8:2, more preferably between about 2:3 and about 3:2. Weight average molecular weight of the alkoxylated amine suppressor may fall between about 1,800 and about 15,000, preferably between about 3,000 and about 8,000. Such preferred suppressors are described, for example, in U.S. Pat. No. 7,303,992 to Paneccasio et al., the subject matter of which is herein incorporated by reference in its entirety. Tristyryl substituted polyoxyalkylene polymers can be useful as suppressors in filling TSVs and in wafer level packaging.

Thus, in one embodiment, the present invention also relates generally to a process for formulating an electrodeposition composition for electrodeposition of copper on a dielectric or semiconductor substrate, the process comprising combining in an aqueous medium a source of copper ions, an acid, a suppressor and a solution of a quaternized poly(epihalohydrin), said solution of poly(epihalohydrin) comprising a polar organic solvent characterized by a boiling point (neat) of at least about 120° C., said quaternized poly(epihalohydrin) comprising n repeating units corresponding to the structure IN and p repeating units corresponding to the structure IP:

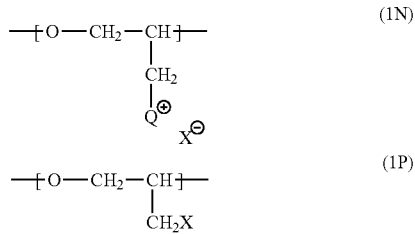

wherein Q has a structure corresponding to that which may be obtained by reacting a pendent methylene halide group of poly(epihalohydrin) with a tertiary amine selected from the group consisting of: (i) $NR^1R^2R^3$ wherein each of $R^1$, $R^2$ and $R^3$ is independently selected from the group consisting of substituted or unsubstituted alkyl, substituted or unsubstituted alkenyl, substituted or unsubstituted alkynyl, substituted or unsubstituted alicyclic, substituted or unsubstituted aralkyl, substituted or unsubstituted aryl and substituted or unsubstituted heterocyclic; (ii) an N-substituted and optionally further substituted heteroalicyclic amine wherein the N-substituent is selected from the group consisting of substituted or unsubstituted alkyl, substituted or unsubstituted alkenyl, substituted or unsubstituted alkynyl, substituted or unsubstituted alicyclic, substituted or unsubstituted aralkyl, substituted or unsubstituted aryl, and substituted or unsubstituted heterocyclic; and (iii) a substituted or unsubstituted nitrogen-containing heteroaryl compound;

n is an integer between 3 and 35, p is an integer between 0 and 25;

X is a halo substituent; and $X^-$ is a monovalent anion.

In a large majority of applications, the plating bath includes an accelerator, for example, a disulfide accelerator such SPS, in a concentration between about 1 and about 100 mg/L. Plating baths used for depositing bumps and pillars may typically also comprise an accelerator. An accelerator may also be used in filling larger concavities such as through silicon vias, but is often not necessary in such application. A compound effective as an accelerator may be used as a brightener in conformal plating of the through holes of a printed circuit board.

Advantageously, the synthesis of the QPECH can be integrated into the formulation of the electrodeposition composition. Conventionally, a QPECH is formed by condensation of pendent methylene halide groups of poly(epihalohydrin) with a a tertiary amine in an aqueous medium. Because the temperatures required for the quaternizing reaction are relatively high, in excess of 95° C., e.g., in the range of 95° to 100° C., quaternization in an aqueous medium requires the reaction to be conducted in a pressure vessel and the reaction mass cooled before it is removed from the reactor, thereby limiting productivity and/or requiring a high pressure heat exchanger to cool any of the reaction mass that may be removed immediately after the reaction.

In the integrated process for formulating the electrodeposition bath, the quaternization reaction is conducted in a medium comprising a relatively high boiling polar organic solvent, preferably having a boiling point of at least about 120° C., e.g., between about 120° and about 220° C., or between about 160° and about 200° C. The use of a high boiling solvent allows the reaction to be conducted at high temperature but ambient pressure, the reaction mass to be removed from the reactor immediately on completion of the reaction cycle, and the reaction mass to be cooled by flow of heat transfer fluid through coils in an atmospheric reaction vessel, or in withdrawal from the reactor through an external heat exchanger which need be pressurized only to the extent incident to fluid flow.

A solution of poly(epihalohydrin) in the polar solvent is initially prepared having a PECH concentration that may typically fall in the range between about 10 and about 35 wt. % A tertiary amine is added in a proportion governed by the extent of quaternization that is to be achieved. The quaternization reaction proceeds at a temperature that is normally in the range of about 160° to 190° C.

In one embodiment, the solution of quaternized poly (epihalohydrin) in a polar organic solvent comprises between 25 and 60 wt. % quaternized poly(epihalohydrin).

In addition, in the solution of quaternized poly(epihalohydrin) in a polar organic solvent, the source of copper ions, the acid, the accelerator, and the suppressor, are combined in the aqueous medium in such relative proportions that the electrolytic deposition composition contains said quaternized polyepihalohydrin in a concentration between 5 and 30 mg/L.

Exemplary polar solvents for the quaternization include, for example, ethylene glycol, propylene glycol, glycerin, ethylene glycol monomethyl ether, ethylene glycol monoethyl ether, ethylene glycol monopropyl ether, ethylene glycol monobutyl ether, propylene glycol monomethyl ether, and dipropylene glycol monomethyl ether. In a batch reaction system, the reaction cycle is generally between 0.5 and 3 hours.

Where polyol/QPECH adducts having the structure of those described in U.S. Pat. Pub. No. 2006/0062753 to Naraghi et al., the subject matter of which is herein incorporated by reference in its entirety, are prepared, epihalohydrin may be polymerized in the presence of a polyol and, typically, a polymerization catalyst such as BF3. The resulting adduct of polyol and PECH is then reacted with a tertiary amine in a polar solvent medium. Where epihalohydrin is polymerized in the presence of a sufficient excess of polyol, unreacted polyol may optionally function thereafter as the solvent for the subsequent quaternization reaction.

Once the reaction is complete and the quaternization reaction mass has been cooled, the reaction mass can be directly combined in an aqueous electrolytic plating bath with the copper salt, suppressor, chloride ion, and, optionally depending on the size and geometry of the base structure, an accelerator. It is generally not necessary to recover the QPECH from the quaternization reaction medium. In these embodiments, the plating composition contains the polar organic solvent, typically in a concentration between 5 and 50 mg/l. The ratio of leveler to polar organic solvent in the electrodeposition solution is typically between about 0.2:1 to 1.5:1, more typically about 1:1.

In other embodiments of the method described herein, a polar solvent is not necessarily present. For example, if the QPECH is acquired in neat form from an independent source, there may be no need or occasion for the presence of a polar solvent in the electrolytic plating bath.

Prior to the electrodeposition step, a seminal conductive layer may be deposited on a semiconductor or dielectric base structure. This conductive layer may comprise, for example, a copper seed layer, a conductive polymer layer or an under bump metal pad. In Damascene plating and filling through silicon vias, this conductive layer is most commonly a copper seed layer as provided by chemical vapor deposition. Alternatively, for example, in the conformal plating of through holes in printed circuit boards, a conductive polymer layer such as a polythiophene, polypyrrole or polyaniline may be deposited on the base structure prior to the electrodeposition step. Preferably, deposit of the seminal conductive layer is preceded by deposit of a barrier layer that inhibits subsequent diffusion of copper into the underlying dielectric or semiconductor base structure. The conductive layer, for example, a copper seed layer provides the cathode for initiating the electrodeposition of copper and defines what can be referred to as the metalizing substrate. In the conformal plating of through holes in printed circuit board, the substrate functioning initially as the cathode may be provided by forming a conductive polymer on the dielectric base structure, and in particular on the through hole wall.

The substrate is immersed in the electrolytic solution and an electrolytic circuit is established comprising the seminal conductive layer, an anode, the aqueous electrolytic solution which is in contact with both the conductive layer and the anode, and a power source having a positive terminal in electrical communication with the anode and a negative terminal in electrical communication with the conductive layer. Electrodeposition of copper then proceeds, at an integrated average current density that preferably varies with the particular application. Generally, the current densities for wafer level packaging and conformal plating of printed circuit boards are relatively high, while Damascene current densities are quite low. Current densities in filling TSVs can be limited by diffusion of leveler into the cavity, thus retarding the deposition rate as the leveler front meet the copper front which grows upwardly as the bottom-up electrodeposition proceeds. Most applications operate at a current density in the relatively broad range between about 1 and about 25 amps/dm2 based on the area of the cathode, i.e., the area of the metalizing substrate.

In certain applications, e.g., filling through silicon vias, it is advantageous to conduct the electrodeposition using the reverse current method described in U.S. Pat. Pub. No. 2014/0120722 to Richardson et al., the subject matter of which is herein incorporated by reference in its entirety. This process includes anodic current intervals at the metalizing surface which serve to desorb leveler that may otherwise cause the copper deposition rate to decline.

The novel electrodeposition process is especially suited for forming an electrolytic copper deposit having a vertical dimension relative to a surface of a semiconductor or dielectric base structure and/or to a copper film on the base structure. For example, the process is effective for filling a concavity in the surface of the base structure such as, e.g., a submicron via or trench in a semiconductor integrated circuit device or a through silicon via (TSV) in a semiconductor assembly such as a stack of integrated circuit chips. The blind via or through hole in the semiconductor base structure having an entry dimension between about 60 and about 190µ and a depth between about 40µ and about 150µ, or between about 60µ and about 100µ.

In plating baths for filling TSVs or other concavities of comparable dimension, an accelerator is sometimes used but is not in all cases essential. TSVs may typically have an aspect ratio between about 0.5 and about 6.

In the Damascene process for filling submicron vias and trenches in a semiconductor base structure of an integrated circuit device, the presence of an accelerator in the plating bath is highly preferred. Submicron vias may have an aspect ratio of greater than 3:1, more often greater than 4:1, e.g., between about 4:1 and about 10:1.

In still other embodiments, the electrodeposition site comprises a molded interconnect device and the concavity comprises an interconnect site to be filled with copper. In such applications, and in filling a cavity comprising a through silicon via or a submicron via or trench, the cavity to be filled with copper is generally in a planar region of base structure. In such instances, the planar region comprises a planar field adjacent the concavity that is ordinarily also plated with a copper overburden during the filling of the concavity. In such applications, it is preferred that the deposit in the through hole is substantially coplanar with the overburden in the field surrounding the through hole, avoiding either a substantial dimple or dome at the top of the copper plug filling the concavity. Thus, in one embodiment, the planarity of the copper deposit within said cavity does not deviate from coplanarity with the copper overburden plated onto said field by more than 50% of the depth of the concavity.

The presence of the QPECH leveler in the plating bath functions to help preserve the planarity of the copper deposit within the cavity relative to the overburden, to such degree, e.g., that the planarity of the deposit within the cavity does not deviate from the coplanarity with copper overburden plated onto the field by more than about 15 µm, more preferably less than about 10 µm. In the case of a TSV having a diameter of about 125 to about 150 µm and a depth of about 60 to about 75 µm, the height of the dome or dimple preferably does not exceed about 15 µm and in the case of a TSV having diameter of between about 100 and about 125 µm and a depth of about 60 to about 75 µm, height of the dome or dimple preferably does not exceed about 12 μm. The QPECH leveler further conduces to forming a copper deposit that fills the via or trench without forming voids, seams, mounding or protrusions in or on the copper deposit.

The concavity or aperture can also be, for example, a through hole in the dielectric base structure for a printed circuit board. A printed circuit board typically in some circumstances comprises a dielectric board having a thickness of between about 0.3 and about 3.0 mm. A through hole in the board has a diameter between about 0.15 and about 0.5 mm. The wall dimension corresponding to the thickness of the board at the location of the through hole. In such application, the process does not function to fill the cavity but rather to plate over the wall of the through hole after it has been prepared and provided with a seminal conductive layer such as a conductive polymer. The QPECH leveler enhances the throwing power of the plating solution and thereby promotes even conformal coating on the through hole wall and on the field comprising the face of the dielectric base structure above and/or below the through hole. In addition to substantially uniform conformal plating over the surface of the wall and over all or part of the face of the base structure surrounding the through hole (the field), the process described herein provides a deposit of substantially uniform thickness over the contour of the base structure in the transition region at the corner between the face and the wall. The uniformity of conformal plating can be measured by the ratio of the minimum average thickness of the copper deposit on the through hole wall to the average thickness of the overburden in the field on the upper and lower faces of the surrounding the through hole (TPmin). For example, the TPmin is preferably at least about 70%, more preferably at least about 90%. Another measure of good throwing power and uniform plating is the ratio of the thickness of the copper deposit taken at a 45° angle at the knee to the average thickness of the deposit on the upper and lower faces of the dielectric base structure surrounding the through hole (TPknee). The TPknee is preferably at least about 60%, more preferably at least about 80%.

These novel levelers are also effective in wafer level packaging applications wherein an electrolytic plating composition containing such a leveler can also be used for building copper bumps and pillars in flip chip packaging or other processes for wafer-level packaging of integrated circuits. In various applications of the electrodeposition process, including forming bumps or pillars, forming a redistribution layer, or filling TSVs, the cavity in which copper is to be deposited is first provided with a dielectric liner such as silicon dioxide or silicon nitride. The dielectric liner can be provided, for example, by chemical vapor deposition or plasma vapor deposition. Alternatively, organic dielectrics can be used to mitigate a coefficient of thermal expansion mismatch. A photoresist wall of the cavity may have sufficient dielectric properties to obviate the need for a further dielectric layer, but the nature of the vapor deposition process may cause a further dielectric layer to form on the photoresist wall as well. A seminal conductive layer is then provided by either chemical vapor deposition of a seed layer or by application of a conductive polymer. In a process for forming bumps and pillars, the seminal conductive layer is deposited only at the bottom of the cavity. The bottom can be flat, or comprise a recess filled with polyimide that promotes better bonding. This embodiment of the process differs from filling TSVs, in which the seminal conductive layer is formed over the entire surface of the cavity, including bottom and sidewalls, and metallization is carried to deposit copper on both bottom and sidewalls.

The process described herein can be used to provide the under bump metal pads for flip chip manufacturing. In this instance, the metalizing substrate is limited to the faces of the bonding pads. Alternatively, with reference to the under bump metal as the floor, i.e., bottom, the process can be used to form a copper bump or pillar by bottom-up filling of the cavity formed at its floor by the under bump pad or under bump metal and on its sides by the wall of an opening in a stress buffer layer and/or photoresist that allows access to the pad or under bump metal. In this application, the aperture size of the cavity is roughly comparable to that of a blind through silicon via, and the parameters of the process for building the bump or pillar are similar to those used for filling blind TSVs. However, the concavity wall provided by openings in photoresist or stress-reducing material is ordinarily not seeded and is therefore non-conductive. Only a semiconductor or dielectric under bump structure at the floor of the cavity is provided with a seminal conductive layer, typically comprising a conductive polymer such as a polyimide. In such embodiments, the process is not as dependent on balance of accelerator and suppressor as it is in the case of bottom filling submicron vias or TSVs.

Plating baths useful in wafer level packaging are similar to those used for Damascene processes and filling TSVs. However, while sulfuric acid is strongly preferred in the latter applications, baths containing either sulfuric acid or alkane sulfonic acids such as methane sulfonic acid are highly advantageous for forming copper bumps and pillars. The novel compositions and processes are effective for forming bumps and pillars of varying dimensions, with a diameter or width ranging from about 20 to about 150 μm and a height ranging from about 20 to about 210 μm. Typically, megabumps have a diameter or width of about 100 to about 150 μm and a height of about 200 to about 210 μm, pillars, have a diameter or width of about 40 to about 60 μm and a height of about 40 to about 100 μm, and microbumps have both a diameter or width and a height in the range of about 20 to about 30 μm.

For each of these applications, the electrolytic plating bath preferably contains copper sulfate or a copper alkanesulfonate in a copper ion concentration between about 25 and about 100 g/L, sulfuric acid or an alkanesulfonic acid in a concentration between about 70 and about 150 g/l, and chloride ion in a concentration of about 30 to about 80 ppm. In a plating bath for forming microbumps and pillars, the acid concentration is preferably in the lower end of the aforesaid range, e.g., between about 70 and about 100 g/L, while in forming megabumps the acid concentration is preferably in the higher end of the range, e.g., 120 and about 150 g/L. Also in microbump and pillar applications, the concentration of copper ion is preferably between about 25 and about 60 g/L.

For megabump applications, the electrolytic bath preferably contains an accelerator in a concentration between about 20 and about 60 mg/L, a suppressor in a concentration between about 1000 and about 3000 mg/L and the quaternized poly(epihalohydrin) in a concentration between about 1 and about 60 mg/L, more preferably about 25 to about 60 mg/L.

The process as described herein can be implemented to achieve high productivity in the manufacture of electronic products. The plating baths containing QPECH levelers can be formulated as described herein to be suitable for each of the several different electrodeposition processes that are incident to the manufacture of an electronic product. For example, bottom-filling of through silicon vias can be conducted in the same plating operation in which printed circuit boards are conformally plated. In such operation, plating a printed circuit board may advantageously include conformal plating of both the face and the walls of through holes in the board. As another example, through silicon vias and submicron vias can both be filled in the same single electrodeposition operation. Each of the substrates on which copper is to be deposited is brought into contact with the same electrodeposition bath and a current is applied, simultaneously depositing a conformal plating on the face and through holes of a printed circuit board and filling through silicon vias, submicron vias and trenches, or all of these in a single plating operation.

To effect such embodiments of the disclosed process, an electronic product assembly, which may contain any combination of printed circuit board through holes, through silicon vias and submicron vias and trenches, may be immersed in the electrodeposition composition and current applied, thereby depositing copper in bottom-up filling of through silicon vias, submicron vias, and submicron trenches, while simultaneously conformally plating the face and through hole walls of a printed circuit board. Such an assembly may comprise, for example, a printed circuit board on which are positioned integrated circuit chips comprising submicron vias or trenches. Alternatively or additionally, stacked chip packages comprising through silicon vias may be positioned on the circuit board.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

The following examples further illustrate the preferred embodiments of the electrodeposition composition and process.

EXAMPLE 1

Poly(epichlorohydrin) having a weight average molecular weight of 2,000 (27.8 g; 0.3 moles polyether repeating units) was dispersed in an agitated ethylene glycol reaction medium (100 ml). The reaction medium having PECH dispersed therein was heated to 50° C. and 3-hydroxypropyldimethylamine (15.5 g; 0.15 moles) was added to the heated reaction medium. The temperature of the reaction medium was maintained at 170° C. for 2 hours. As the quaternized PECH was formed in the reaction, it was dissolved in the polar solvent medium. Typically about 10% conversion is sufficient to eliminate the dispersed phase. The product of the reaction was a solution (154 g) containing QPECH (43.2 g) in ethylene glycol at a concentration of 28 wt. %. The extent of quaternization was 0.50, i.e., in the product QPECH:

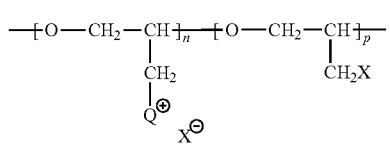

(I)

n=p and n/n+p=0.50. The values of n and p were approximately 10, and the molecular weight of the QPECH (excluding the chloride ions) was approximately 2,700. The polymer was designated L1-0.50.

EXAMPLE 2

Several additional QPECHs were prepared by reaction of PECH with 3-hydroxypropyldimethylamine. The reactions were carried out in the manner described in Example 1 except that the proportion of 3-hydroxypropyldimethylamine relative to PECH was varied. In particular, the values of n/n+p were varied from 0.10 to 0.70.

EXAMPLE 3

Polarization tests were conducted on the levelers prepared in Examples 1 and 2. In each test, a chronopotentiometry curve was obtained on an electrodeposition solution containing one of the levelers. The chronopotentiometry curves were obtained using a standard potentiostat instrument with a Pt working electrode bearing a freshly deposited Cu layer having a thickness of 2 µm, a copper counter electrode and an $Hg/Hg_2SO_4$ reference electrode. Each tested solution contained $CuSO_4$ (50 g/L Cu ion), sulfuric acid (100 g/L), an SPS accelerator (22 ppm), a polyethylene glycol suppressor (600 ppm), and the leveler of Example 1 or 2 (15 ppm).

For each leveler, a curve was obtained under agitation at 1000 rpm and another curve was obtained under agitation at 100 rpm. Where polarization at 100 rpm exceeds polarization at 1000 rpm, the curves indicate favorable properties of the QPECH as a leveler effective for promoting bottom filling of a via in either a submicron feature of a semiconductor base structure or a through silicon via.

The chronopotentiometry curves of this Example are shown in FIG. 1. The data are summarized in Table 1. ΔV is the difference between the extent of polarization at 1000 rpm and the extent of polarization at 100 rpm. Greater polarization at the higher rotation rate indicates that the leveler will function to promote bottom-up filling of the via.

TABLE 1

| Leveler | mol % Rxn | Normalized Potential @ 1000 RPM | ΔV |
| --- | --- | --- | --- |
| L1-0.10 | 10 | Insoluble | N/A |
| L1-0.20 | 20 | ~(−1.020) | 13 |
| L1-0.30 | 30 | ~(−1.050) | 14 |
| L1-0.40 | 40 | ~(−1.070) | 13 |
| L1-0.50 | 50 | ~(−1.120) | 14 |
| L1-0.60 | 60 | ~(−1.050) | 24 |
| L1-0.70 | 70 | ~(<1.000) | −20 |

The normalized potential is computed by dividing measured potential by the potential exhibited by the bath comprising L1-030.

It may be seen from these data that the strongest polarization effect was achieved using leveler L1-0.50 wherein the extent of quaternization was 50%, i.e., n/n+p=0.50. Note that a PECH polymer was not soluble in the electrodeposition solution until the extent of quaternization expressed as mol % reaction was at least 20% (n/n+p 0.20).

Figure 2:
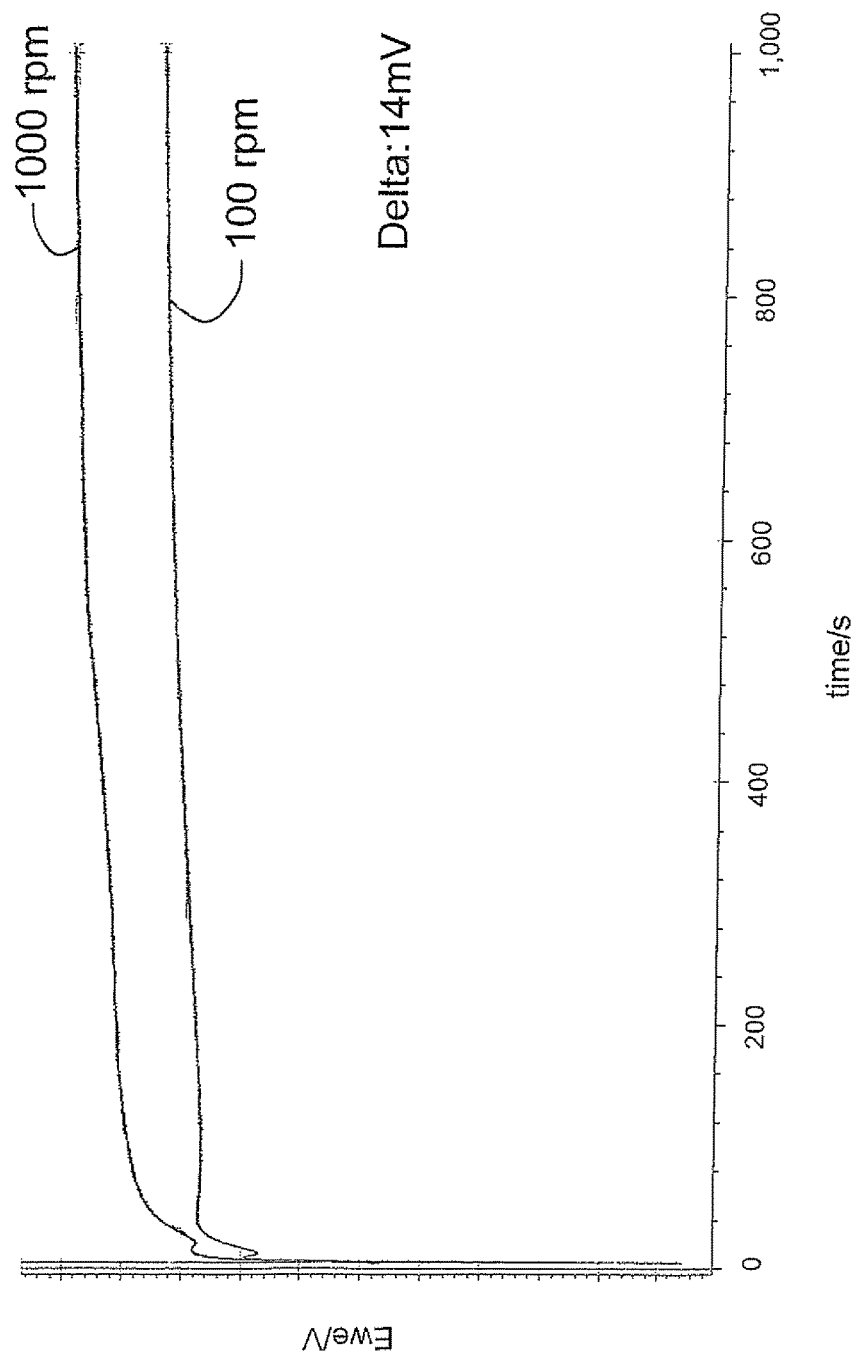
FIG. 2 isolates from FIG. 1 the polarization curves for a preferred leveler as obtained under agitation at 1000 rpm vs. 100 rpm.

FIG. 2 shows the polarization curves for leveler L1-0.50 alone at 1000 and 100 rpm. It may be seen that a distinctly favorable difference between the potential at 1000 rpm and the potential at 100 rpm (ΔV) is maintained throughout the course of the polarization test.

EXAMPLE 4

According to the process as generally described in Example 1, a series of levelers were prepared by quaternizing PECH by reaction with varying proportions of n-butyldimethylamine. The mol % reaction (n/n+p) varied in 10% increments from 20% to 90%.

Electrodeposition solutions containing these levelers were subjected to polarization tests in the manner described in Example 3. The solutions had the same composition as those described in Example 3 except for the nature of the leveler.

Figure 3:
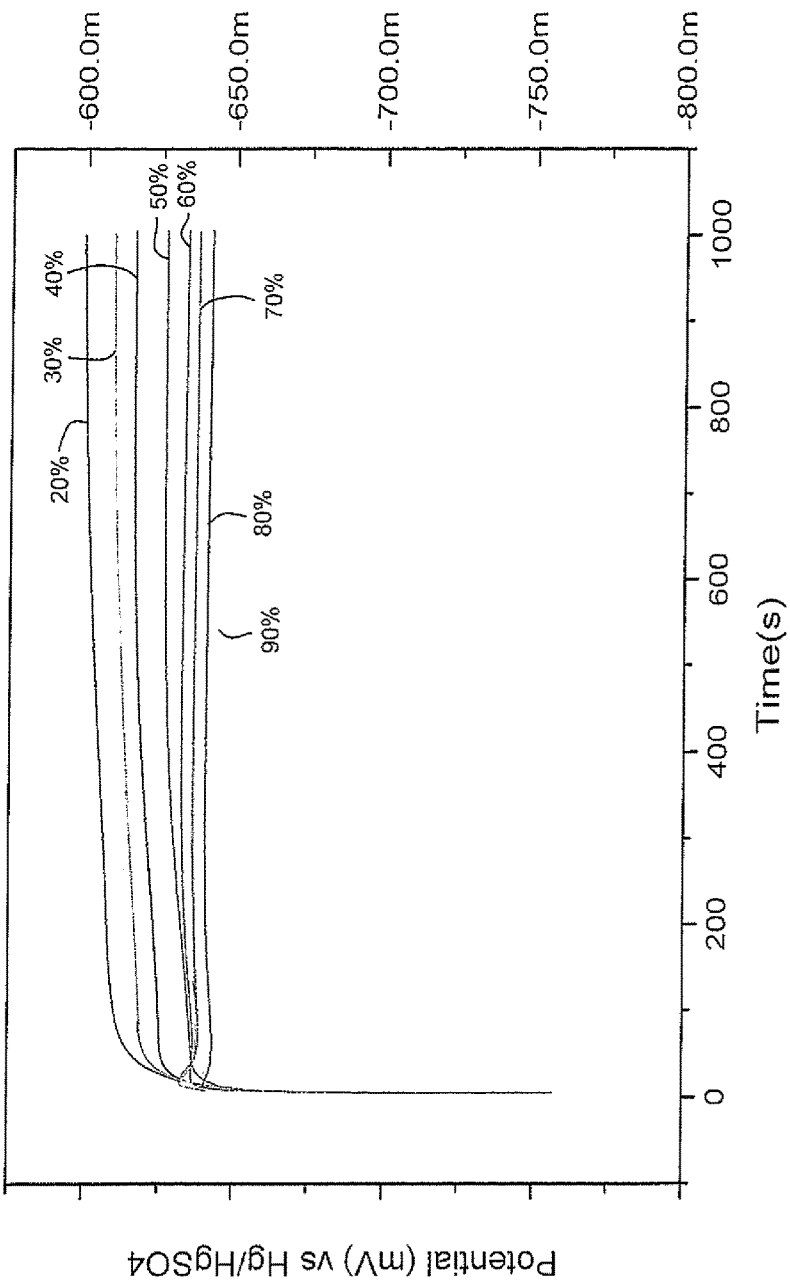
FIG. 3 depicts chronopotentiometry curves obtained from an electrodeposition solution containing levelers prepared by quaternization of poly(epichlorohydrin) by reaction with n-butyldimethylamine, as conducted under agitation at 1000 rpm.

The 1000 rpm chronopotentiometry curves of this Example are shown in FIG. 3. The data at 1000 rpm and the ΔV between the polarization values at 1000 rpm vs. polarization values at 100 rpm are summarized in Table 2.

TABLE 2

| Leveler | mol % Rxn | Normalized Potential @ 1000 RPM | ΔV |
|---|---|---|---|
| L2-0.10 | 10 | insoluble | N/A |
| L2-0.20 | 20 | ~(−1.000) | 14 |
| L2-0.30 | 30 | ~(−1.017) | 14 |
| L2-0.40 | 40 | ~(−1.033) | 14 |
| L2-0.50 | 50 | ~(−1.050) | 12 |
| L2-0.60 | 60 | ~(−1.055) | 13 |
| L2-0.70 | 70 | ~(−1.065) | 13 |
| L2-0.80 | 80 | ~(−1.075) | 17 |
| L2-0.90 | 90 | ~(−1.08) | 18 |

Normalized potential is computed on the same principle as Table 1.

Figure 4:
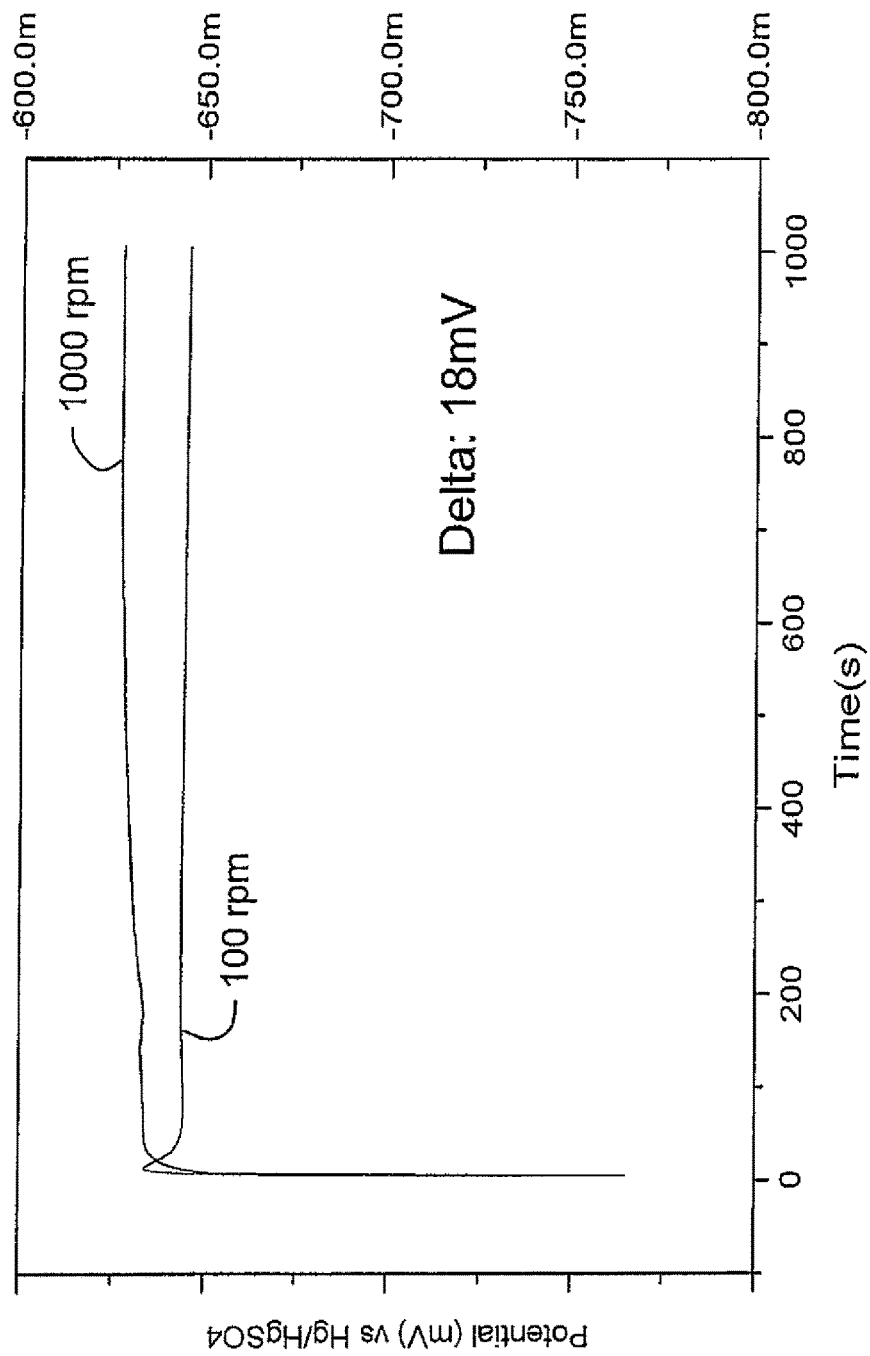
FIG. 4 depicts the polarization curves as obtained under agitation at 1000 rpm and 100 rpm, respectively, for a leveler produced by reaction of poly(epichlorohydrin) with n-butyldimethylamine to a preferred degree of quaternization.

It may be seen from these data that the strongest polarization effect was achieved using the leveler having the highest degree of quaternization, i.e., where n/n+p=0.90. FIG. 4 displays the polarization curves for leveler L2-0.90 (n/n+p=0.90) at 1000 rpm and 100 rpm, respectively, illustrating the ΔV of 18 mV that is achieved using this preferred leveler.

The results of this Example indicate a significant difference between the optimal degree of quaternization using a relatively polar tertiary amine such as 3-hydroxypropyldimethylamine vs. the optimal degree of quaternization using a relatively hydrophobic tertiary amine such as n-butyldimethylamine.

EXAMPLE 5

According to the process as generally described in Example 1, a series of levelers was prepared by quaternizing PECH by reaction with varying proportions of benzyldimethylamine. Levelers were prepared at n/n+p values of 0.20, 0.40, 0.50, 0.60 and 0.80.

Electrodeposition solutions containing these levelers were subjected to polarization tests in the manner described in Example 3. The solutions had the same compositions as those described in Example 3 except for nature of the leveler.

Figure 5:
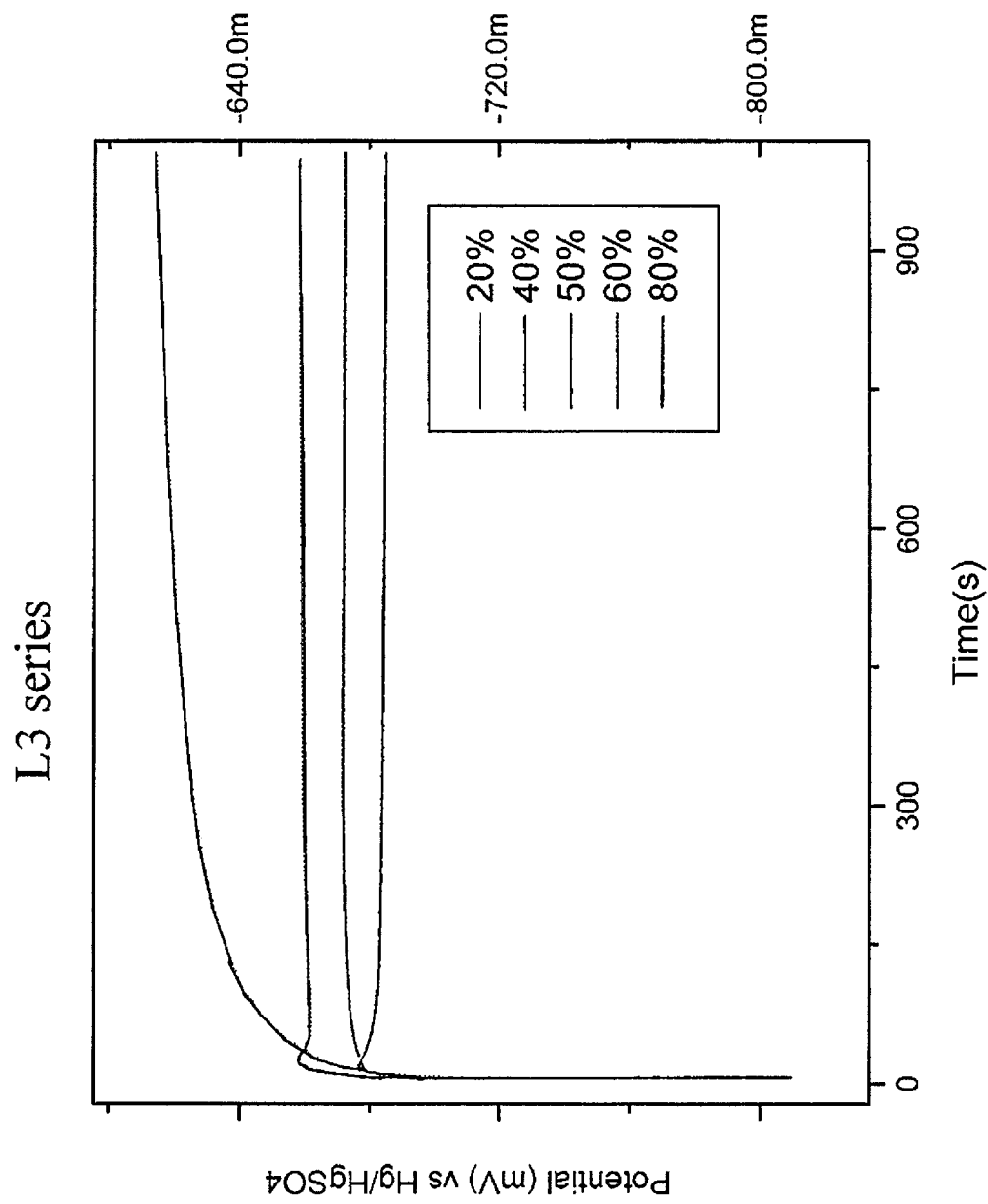
FIG. 5 depicts chronopotentiometry curves obtained at 1000 rpm from an electrodeposition solution containing levelers prepared by quaternization of poly(epichlorohydrin) by reaction with benzyldimethylamine.

The 1000 rpm chronopotentiometry curves of this Example are shown in FIG. 5. The data at 1000 rpm and the ΔV vs. polarization at 100 rpm are summarized in Table 3.

TABLE 3

| Leveler | mol % Rxn | Normalized Potential @ 1000 RPM | ΔV |
|---|---|---|---|
| L3-0.20 | 20 | ~(−1.092) | 17 |
| L3-0.40 | 40 | ~(−1.142) | 17 |
| L3-0.50 | 50 | ~(−1.142) | 14 |

TABLE 3-continued

| Leveler | mol % Rxn | Normalized Potential @ 1000 RPM | ΔV |
|---|---|---|---|
| L3-0.60 | 60 | ~(−1.125) | 15 |
| L3-0.80 | 80 | ~(−1.075) | 20 |

Normalized on same principle as Table 1

Figure 6:
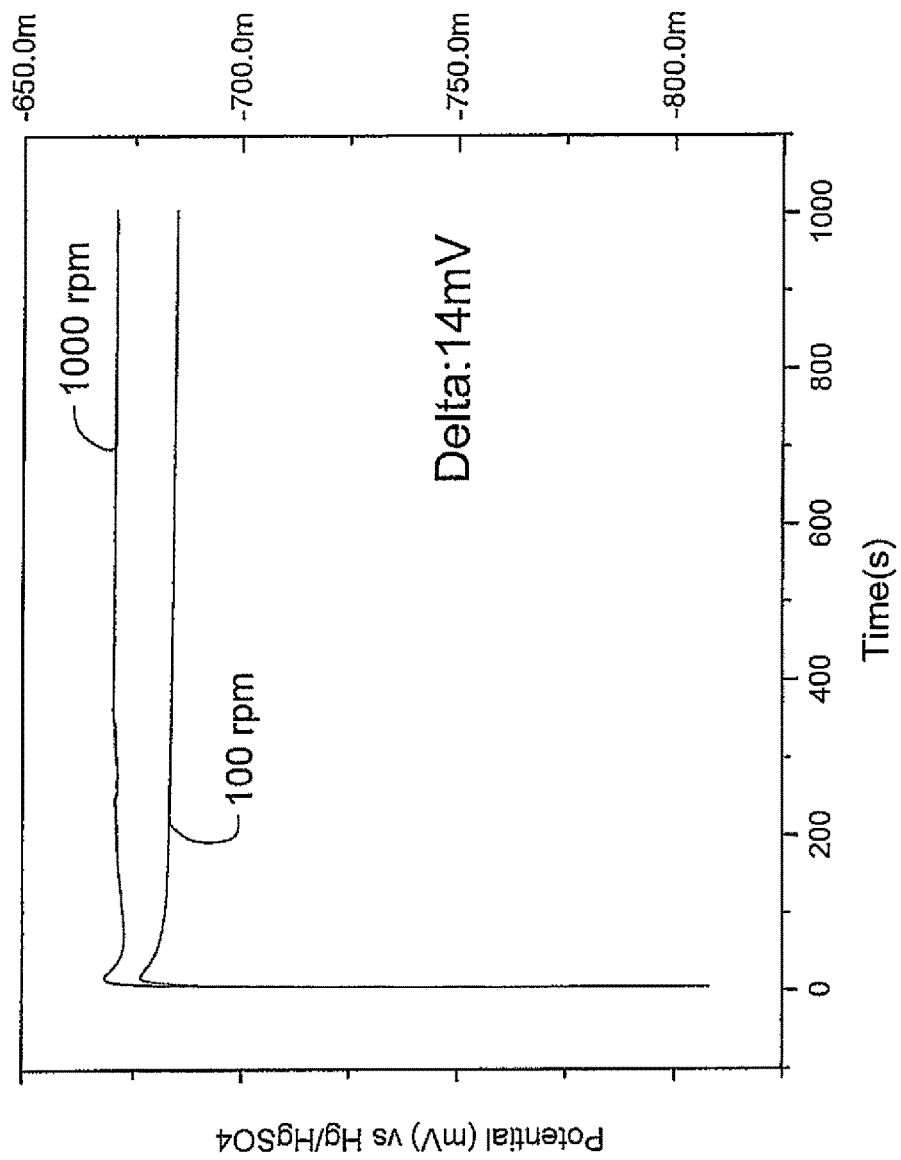
FIG. 6 displays the polarization curves as obtained under agitation at 1000 rpm and 100 rpm, respectively, for a leveler produced by reaction of poly(epichlorohydrin) with benzyldimethylamine to a preferred degree of quaternization.

It may be seen from these data that the strongest polarization effect was achieved using a leveler wherein n/n+p is about 0.40 to about 0.50. The polarization curves for leveler L3-0.50 at both 1000 rpm and 100 rpm are charted in FIG. 6.

EXAMPLE 6

Three electrodeposition compositions were prepared containing leveler L1-0.50 and having the compositions shown in Table 4.

TABLE 4

| Bath | $CuSO_4$ | $H_2SO_4$ | $Cl^-$ ion | SPS | Suppr | L1-0.50 |
|---|---|---|---|---|---|---|
| 6-1 | 50 g/l $Cu^{++}$ | 100 g/l | 50 ppm | | | |
| 6-2 | 50 g/l $Cu^{++}$ | 100 g/l | 50 ppm | 50 mg/l | 100 mg/l | 50 mg/l |
| 6-3 | 50 g/l $Cu^{++}$ | 100 g/l | 50 ppm | 55 mg/l | 40 mg/l | 40 mg/l |

The suppressor comprised butanol alkoxylated with ethylene oxide and propylene oxide in a weight ratio of PO to EO of about 1:1. It had a molecular weight of 3,500.

Each of the electrodeposition compositions was used for filling a blind microvia having an entry dimension of 5 mil (127 μm) and a depth of 80 μm, and for conformal plating of a 0.2 mm diameter×1 mm deep through hole, in a test vehicle subjected to electrodeposition in a Haring cell at an average current density of 2 amps/dm² based on the area of the metalizing substrate. Depth of the overburden, dimple shape and vertical dimension of the dimple in filling the vias are summarized in Table 5.

TABLE 5

| Bath | Overburden | Dimple | Dimple shape |
|---|---|---|---|
| 6-1 | 20 μm | 23 μm | U-shape |
| 6-2 | 20 μm | 19 μm | U-shape |
| 6-3 | 20 μm | 10 μm | U-shape |

Parameters reflecting the conformality of the deposit on the through holes are summarized in Table 6:

TABLE 6

| Bath | $TP_{min}$ (X-axis) | $TP_{knee}$ (X-axis) | Flow Mark |
|---|---|---|---|
| 6-1 | 76% | 78.8% | No |
| 6-2 | 75.5% | 80.7% | No |
| 6-3 | 49.1% | 54% | slightly |

EXAMPLE 7

An electrodeposition bath was prepared containing $CuSO_4$ (50 g/L $Cu^{++}$), sulfuric acid (100 g/L), chloride ion (50 ppm), SPS (1 ppm), the suppressor used in Example 6

(1000 ppm), and leveler L1-0.50 (15 ppm). This bath was used for filling two blind 5 mil×80 μm microvias and plating a 0.2 mm diameter x 1.00 mm deep through hole in each of two test vehicles subjected to electrodeposition in a Haring cell.

Electrodeposition was conducted for 60 minutes at a current density of 2 amps/dm² based on the area of the metalizing substrate. The bath was agitated under the anode at a rate of 140 L/hr per side. Results of these experiments in filling the vias are summarized in Table 7:

TABLE 7

| Via No. | Overburden | Dimple | Dimple shape |
| --- | --- | --- | --- |
| 7A | ~20 μm | ~21 μm | U-shape |
| 7B | ~21 μm | Voiding | U-shape |
| 7C | ~20 μm | ~19 μm | U-shape |
| 7D | ~21 μm | Voiding | U-shape |

$TP_{min}$ and $TP_{knee}$ were determined for a cross-section along the X-axis of the through hole in one test vehicle and for cross-sections along both the Y-axis and the Y-axis of the through hole in the other test vehicle. Results of these plating experiments are summarized in Table 8:

TABLE 8

| PCB | $TP_{min}$ (X-axis) | $TP_{knee}$ (X-axis) | $TP_{min}$ (Y-axis) | $TP_{knee}$ (Y-axis) |
| --- | --- | --- | --- | --- |
| 7E | 75.99% | 78.84% | — | — |
| 7F | 75.53% | 80.65% | 87.53% | 81.31% |

EXAMPLE 8

Two blind vias were filled and a through hole plated substantially as described in Example 7 except that the plating bath contained only 40 g/L sulfuric acid and 40 ppm chloride ion. Dimensions of the vias and through holes were the same as in Example 7.

Both vias were successfully filled without voids or seams. After the filling cycle, overburden surrounding one of the vias was ~20 μm and the fill had a dimple of ~17μ. Overburden surrounding the other of the two vias was ~20 μm and the fill had a dimple of ~25 μm.

On the X-axis, the through hole had a $TP_{min}$ of 49.1% and $TP_{knee}$ of 53.99%. On the Y-axis, the through hole had a $TP_{min}$ of 52.99% and a $TP_{knee}$ of 71.39%.

EXAMPLE 9

Filling of 5 mil×80μ blind vias and conformal plating of a 0.2 mm×1 mm through hole in a test vehicle was scaled up to operation in a 10 L tank. The plating bath contained CuSO4 (50 g/L Cu++), sulfuric acid (100 g/L), chloride ion (50 ppm), SPS (2.7 ppm), the suppressor described in Example 6 (116 ppm) and leveler L1-0.50 (10.4 ppm).

Both in filling the blind vias and plating the through hole, current was applied at a density of 2 amps/dm2 for 60 minutes while the bath was agitated at 4.4 L/min by use of an eductor.

Overburden surrounding one of the vias was ~16μ and the dimple in the fill had a depth of ~6 μm. Overburden surrounding the other of the two vias was ~14 μm but there was voiding in the fill.

In plating the through hole, TPmin taken along the X-axis was 116.73% and the TPknee was 73.85%. TPmin along the Y-axis was 87.39% and the $TP_{knee}$ was 65.61%.

EXAMPLE 10

An electrodeposition solution was prepared containing CuSO4 (50 g/L Cu++), sulfuric acid (100 g/L), chloride ion (50 ppm), SPS (22 mg/L), polyethylene glycol having a weight average molecular weight of about 20,000 (600 mg/L) and leveler L2-0.20 (15 mg/L).

Blind vias were filled from the electrodeposition solution at a current density of 2 amp/dm2 based on the area of the metalizing substrate. A via having an entry dimension of 100μ and a depth of 60 μm was filled successfully with only a modest dimple. When the same composition and conditions were used in filling a via having an entry dimension of 100 μm and a depth of 100 μm, the deposit was substantially conformal.

EXAMPLE 11

Blind vias having the dimensions described in Example 10 were filled using an electrodeposition composition and current density the same as in Example 10 except that L2-0.90 rather than L2-0.20 was used as the leveler. Both vias were filled with minimal dimple formation but a void appeared in the copper plug filling the 100 μm by 100 μm via. The deposit in the 60 μm×100 μm via was substantially free of voids and seams.

EXAMPLE 12

Blind vias having the dimensions described in Example 10 were filled using an electrodeposition composition and current density the same as in Example 10, except that L2-0.90 rather than L2-0.20 was used as the leveler. Both vias were filled without voids and with minimal dimple formation.

EXAMPLE 13

A series of electrodeposition compositions was prepared containing Cu sulfate (50 g/L Cu++ ions), sulfuric acid (100 g/L), chloride ion (50 ppm), SPS accelerator, the suppressor described in Example 6 (1000 ppm) and a leveler consisting of polyepichlorohydrin, 50% of the pendent methylene chloride groups of which had been quaternized by reaction with 2[2-(dimethylamino)-ethoxy]ethanol. The concentration of SPS was varied over a range of 1 to 20 ppm and the concentration of the QPECH leveler was varied over a range of 5 to 25 ppm.

Each of these electrodeposition compositions was used to fill 5 mil×80 μm blind vias and conformally plate a 0.2 mm diameter×1.00 mm through hole in a test vehicle subjected to electrodeposition in a Haring cell at a current density of 2 A/dm² for 60 minutes at ambient temperature.

Additive concentrations in the electrodeposition baths, average overburden formed in filling the blind vias, average dimple depth in filling the vias, and the average $TP_{min}$ and $TP_{knee}$ values obtained for the conformally plated through hole are set forth in Table 9.

TABLE 9

| Run | Accel. conc. | Suppr. Conc. | Leveler Conc. | overburden avg. (µm) | dimple avg. (µm) | T/H TP avg. (%) | T/H knee TP avg. (%) |
|---|---|---|---|---|---|---|---|
| 1 | 20 | 1000 | 5 | 18.68 | 87.55 | 75.53 | 93.90 |
| 2 | 1 | 1000 | 5 | 17.94 | 10.74 | 82.88 | 69.23 |
| 3 | 10.5 | 1000 | 15 | 21.28 | 67.20 | 83.55 | 59.83 |
| 4 | 20 | 1000 | 25 | 19.71 | 87.29 | 73.23 | 69.45 |
| 5 | 1 | 1000 | 25 | 18.79 | 10.03 | 89.95 | 73.93 |
| 6 | 20 | 1000 | 5 | 21.78 | 89.93 | 66.15 | 88.58 |
| 7 | 1 | 1000 | 5 | 21.25 | 9.14 | 79.85 | 69.15 |
| 8 | 10.5 | 1000 | 15 | 20.61 | 73.96 | 76.45 | 61.58 |
| 9 | 20 | 1000 | 25 | 19.56 | 74.39 | 96.93 | 48.38 |
| 10 | 1 | 1000 | 25 | 18.87 | 11.51 | 87.90 | 68.68 |

EXAMPLES 14-19

A series of electrodeposition compositions was prepared containing Cu sulfate (50 g/L Cu$^{++}$), sulfuric acid (100 g/L), chloride ion (50 ppm), the suppressor described in Example 6 (1000 ppm) and varying concentrations of accelerator (SPS) and leveler. The leveler was produced by quaternizing PECH by reaction with 2[2-(dimethylamino)-ethoxy]ethanol as described in Example 13. The leveler/accelerator weight ratio ranged from 4:1 to 12:1.

The electrodeposition compositions were used in filling blind vias having an entry dimension of 5 mils and a depth of 80 µm and conformally plating a through hole having a diameter of 0.2 mm and a depth of 1.00 mm in a test vehicle subjected to electrodeposition in a Haring cell at a current density of 2 A/dm$^2$ for 60 minutes under agitation of 140 L/H/side at ambient temperature.

Compositions of the plating baths, the overburden and dimple dimensions of the copper filling the vias at two different locations in the test vehicle, and the TP$_{min}$ and TP$_{knee}$ determinations along both X- and Y-axis for the copper film plating the through hole are set forth in Table 10.

TABLE 10

|  | Ex. 14 | Ex. 15 | Ex. 16 | Ex. 17 | Ex. 18 | Ex. 19 |
|---|---|---|---|---|---|---|
| [accel.] | 3 ppm | 3 ppm | 3 ppm | 8 ppm | 8 ppm | 8 ppm |
| [suppr.] | 1000 ppm | 1000 ppm | 1000 ppm | 1000 ppm | 1000 ppm | 1000 ppm |
| [level.] | 12 ppm | 24 ppm | 36 ppm | 32 ppm | 64 ppm | 96 ppm |
| Overburden | ~20 µm | ~20 µm | ~20 µm | ~20 µm | 16-17 µm | ~20µ void. |
|  |  |  | 14-16 µm | 15-16 µm | voiding |  |
| Dimple | 6-7 µm | 8-10 µm | 9-11 µm | 8-10 µm | 16, 18 µm | ~15 µm |
|  | 17-19 µm | 17-19 µm | 17-19 µm | 11, 15 µm | voiding | Void. |
| TP$_{min}$ X-axis | 84.89% | 91.73% | 100.90% | 103.37% | 99.07% | 103.40% |
| TP$_{knee}$ X-axis | 67.14% | 67.93% | 76.67% | 60.26% | 79.10% | 73.66% |
| TP$_{min}$ Y-axis | 90.07% | 97.21% | 85.27% | 109.90% | 91.73% | 100.87% |
| TP$_{knee}$ Y-axis | 59.52% | 67.01% | 80.42% | 63.31% | 77.01% | 74.24% |

EXAMPLES 20-25

A series of electrodeposition compositions was prepared containing Cu sulfate (50 g/L Cu$^{++}$), sulfuric acid (100 g/L), chloride ion (50 ppm), and the suppressor described in Example 6 (300 ppm), together with varying concentrations of SPS and the leveler produced as described in Example 13. The leveler/accelerator weight ratio ranged from 4:1 to 12:1.

The electrodeposition compositions were used to for filling each of two 5 mil×80 µm blind vias and conformally plating a 0.2 mm×1.00 through hole in a test vehicle subjected to electrodeposition in a Haring cell at a current density of 2 A/dm$^2$ for 60 minutes at ambient temperature with air agitation under the anode.

Compositions of the plating baths, the overburden and dimple dimensions of the copper filling the blind vias and the TP$_{min}$ and TP$_{knee}$ along both X- and Y-axis for the copper film plating the through hole are set forth in Table 11.

TABLE 11

|  | Ex. 20 | Ex. 21 | Ex. 22 | Ex. 23 | Ex. 24 | Ex. 25 |
|---|---|---|---|---|---|---|
| [accel.] | 12 ppm | 3 ppm | 3 ppm | 8 ppm | 8 ppm | 8 ppm |
| [suppr.] | 300 ppm | 300 ppm | 300 ppm | 300 ppm | 300 ppm | 300 ppm |
| [level.] | 12 ppm | 24 ppm | 36 ppm | 32 ppm | 64 ppm | 96 ppm |
| Overburden | ~18 µm | ~19 µm | 17-19 µm | 19-20 µm | ~20 µm | ~20 µm |
|  | 18-20 µm | 12-13 µm | 15-16 µm | ~18 µm |  | ~16 µm |
| Dimple | ~13 µm | ~8 µm | Voiding | ~10 µm | 15-16 µm | 15-17 µm |
|  | 31-33 µm | 12-13 µm | Voiding | voiding |  | Void. |

TABLE 11-continued

|  | Ex. 20 | Ex. 21 | Ex. 22 | Ex. 23 | Ex. 24 | Ex. 25 |
|---|---|---|---|---|---|---|
| $TP_{min}$ X-axis | 71.49% | 86.26% | 97.90% | 86.96% | 81.34% | 78.32% |
| $TP_{knee}$ X-axis | 57.54% | 63.20% | 55.26% | 53.95% | 71.29% | 60.98% |
| $TP_{min}$ Y-axis | 72.13% | 85.98% | 84.14% | 78.83% | 87.12% | 83.55% |
| $TP_{knee}$ Y-axis | 64.05% | 63.60% | 58.71% | 59.18% | 66.80% | 66.92% |

EXAMPLE 26

An electrodeposition composition was prepared containing Cu sulfate (50 g/L $Cu_{++}$), sulfuric acid (100 g/L), chloride ion (50 ppm), SPS (5 ppm), the suppressor described in Example 6 (1000 ppm), and the leveler described in Example 13 (25 ppm).

Five separate runs were conducted in which blind vias at different locations in a test vehicle were filled by electrodeposition from this composition in a Haring cell at a current density of 2 A/dm2 for 60 minutes at room temperature under agitation at a rate of 140 L/H/side.

The test vehicle also contained a 0.2 mm diameter×1.00 mm through hole that was conformally plated in the process.

For each of the five runs, the overburden and dimple dimension of the copper filling the TSVs at two different locations in the semiconductor base structure, and the TPmin and TPknee (along a single axis) for the copper film plating the PCB through holes are set forth in Table 12.

TABLE 12

|  | 26-1 | 26-2 | 26-3 | 26-4 | 26-5 | Average |
|---|---|---|---|---|---|---|
| [accel.] | 5 ppm | 5 ppm | 5 ppm | 5 ppm | 5 ppm |  |
| [suppr.] | 1000 ppm | 1000 ppm | 1000 ppm | 1000 ppm | 1000 ppm |  |
| [level.] | 25 ppm | 25 ppm | 25 ppm | 25 ppm | 25 ppm |  |
| Over-burden | 16.84 μm 15.72 μm | 16.73 μm 16.54 μm | 16.05 μm 15.85 μm | 17.02 μm 17.27 μm | 17.58 μm 15.56 μm | 16.52 μm |
| Dimple | 7.74 μm | 7.3 μm | 7.19 μm | 7.08 μm | 6.79 μm | 7.17 μm |
| $TP_{min}$ X-axis | 83.98% | 84.57% | 90.29% | 89.03% | — | 86.97% |
| $TP_{knee}$ X-axis | 55.77% | 58.97% | 52.85% | 50.95% | — | 54.64% |

EXAMPLE 27

The tests conducted in Example 26 were replicated in a cell comprising a 10 liter tank. Four separate runs were made. The results are set forth in Table 13.

TABLE 13

|  | 27-1 | 27-2 | 27-3 | 27-4 |
|---|---|---|---|---|
| [accel.] | 5 ppm | 5 ppm | 5 ppm | 5 ppm |
| [suppr.] | 1000 ppm | 1000 ppm | 1000 ppm | 1000 ppm |
| [level.] | 25 ppm | 25 ppm | 25 ppm | 25 ppm |
| Over-burden | 17.21 μm 16.87 μm | 17.51 μm 17.02 μm | 16.54 μm 16.54 μm | 17.02 μm 17.45 μm |
| Dimple | 10.21 μm | 10.93 μm | 9.21 μm | 8.04 μm |
| $TP_{min}$ X-axis | 113.25% | 119.61 | 124.39% | — |
| $TP_{knee}$ X-axis | 70.32% | 70.45% | 67.18% | — |

EXAMPLE 28

Five Electrodeposition compositions were prepared, each comprising $CuSO_4$ (50 g/l $Cu_{++}$ ions), sulfuric acid (100 g/l), chloride ion (50 ppm), SPS (1 mg/l), and a polyethylene glycol suppressor (1000 mg/l). To each of the solutions a leveler was added consisting of the reaction product of polyepichlorohydrin and hydroxypropyldimethylamine (15 mg/l). The extent of quaternization was 50%.

Each electrodeposition bath was aged for 1.29 A-hr/l, after which a copper foil was deposited from the composition at a current density of 2 A/dm² for 60 minutes. The foils were then subjected to elongation tests. Results of these tests are set forth in Table 14.

TENSILE STRENGTH AND ELONGATION

| Sample Designation Conditions Sample No. | Extent of Quaternization | Electro copper foil 2A/dm² Thickness of copper foils (mm) | Ambient Tensile Strength (MPa) | 24° C., 53% RH Percent Elong. (%) | Average Elong. (%) |
|---|---|---|---|---|---|
| 28-1 | | 0.068 | 317 | 13.06 | 13.4 |
| 28-2 | | 0.072 | 308 | 12.70 | |
| 28-3 | | 0.071 | 310 | 13.18 | |
| 28-4 | | 0.065 | 316 | 13.25 | |
| 28-5 | | 0.067 | 315 | 14.97 | |

EXAMPLE 29

An electrodeposition bath was prepared comprising CuSO4 (50 g/l Cu$_{++}$ ions), sulfuric acid (100 g/l), chloride ion (50 ppm), SPS (5 mg/l), and the suppressor of Example 6 (1000 mg/l). To each of the solutions a leveler was added consisting of the reaction product of polyepichlorohydrin and 2-[2-(dimethylamino)ethoxy]ethanol (25 mg/l). The extent of quaternization was 50%.

Using the baths thus prepared, ten separate electro-depositions were conducted, in each of which a copper foil was deposited from one of the electrodeposition compositions at a current density of 2 A/dm² for 60 minutes. Each of the foils was then subjected to elongation test. Results of these tests are set forth in Table 15.

TABLE 15

Pre-load: 1 N
Pre-load speed: 10 mm/min
Test speed: 50 mm/min

| nr | a0 mm | b0 in | Tensile Stress kg/mm² | Elongation % | εRm % | S0 mm² |
|---|---|---|---|---|---|---|
| 1 | 0.066 | 0.5 | 30.42 | 20.75 | 19.57 | 0.8382 |
| 2 | 0.066 | 0.5 | 29.7 | 23.7 | 22.78 | 0.8382 |
| 3 | 0.066 | 0.5 | 31.01 | 20.45 | 19.7 | 0.8382 |
| 4 | 0.066 | 0.5 | 31.72 | 17.85 | 16.89 | 0.8382 |
| 5 | 0.066 | 0.5 | 28.27 | 18.24 | 17.49 | 0.8382 |
| 6 | 0.066 | 0.5 | 27.77 | 18.8 | 18.14 | 0.8382 |
| 7 | 0.066 | 0.5 | 32.14 | 19.57 | 18.91 | 0.8382 |
| 8 | 0.066 | 0.5 | 30.53 | 20.06 | 18.91 | 0.8382 |
| 9 | 0.066 | 0.5 | 30.62 | 22.14 | 20.27 | 0.8382 |
| 10 | 0.066 | 0.5 | 31.19 | 20.96 | 20.11 | 0.8382 |
| avg. | | | 30.25 | 20.13 | | |

What is claimed is:

1. A process for electrodeposition of copper on a dielectric or semiconductor base structure, the method comprising:

contacting a metalizing substrate comprising a seminal conductive layer on the base structure with an aqueous electrolytic deposition composition; and supplying electrical current to the electrolytic deposition composition to deposit copper on the substrate;

wherein the aqueous electrolytic composition comprises: copper ions; an acid; a suppressor; and a quaternized poly(epihalohydrin) comprising n repeating units corresponding to structure 1N and p repeating units corresponding to structure 1P:

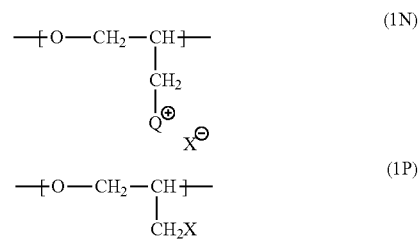

wherein Q has a structure corresponding to a substituted or unsubstituted nitrogen-containing heteroaryl compound; n is an integer between 3 and 35, p is an integer between 0 and 25; and wherein n/(n+p)≤1; X is a halo substituent; and X– is a monovalent anion, and wherein Q is

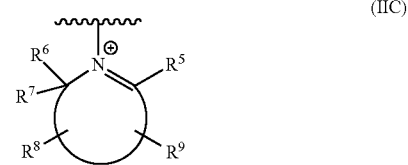

wherein structure IIC is a heterocyclic moiety and each of R⁵, R⁶, R⁷, R⁸ and R⁹ is independently selected from the group consisting of hydrogen, substituted or unsubstituted alkyl, substituted or unsubstituted alkenyl, substituted or unsubstituted alkynyl, substituted or unsubstituted aralkyl, substituted or unsubstituted alicyclic, and substituted or unsubstituted aryl, and substituted or unsubstituted heterocyclic.

2. The process as set forth in claim 1, wherein the aqueous electrolytic composition comprises a polar organic solvent having a boiling point (neat) of at least 120° C.

3. A process as set forth in claim 1 wherein the quaternized poly(epihalohydrin) comprises additional repeating units comprising residues of at least one alkylene oxide.

4. A process as set forth in claim 3, wherein the residues of alkylene oxide are selected from the group consisting of ethylene oxide, propylene oxide, butylene oxide, 3,4-epoxy-1-butanol, 2,3-epoxy-1-propanol, glycidol, and combinations of one or more of the foregoing.

5. A process as set forth in claim 1, wherein repeating units of the poly(epihalohydrin) consist essentially of residues of epihalohydrin and residues of quaternized epihalohydrin corresponding to Structure (I):

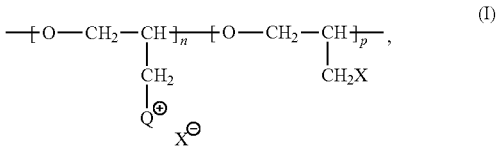

wherein the quaternized poly(epihalohydrin) repeating units and non-quaternized epihalohydrin repeating units in said quaternized poly(epihalohydrin) are arranged in a block, alternating or random configuration.

6. A process as set forth in claim 1, wherein Q corresponds to the structure that may be obtained by reacting a pendent methylene chloride group of poly(epihalohydrin) with a tertiary amine selected from the group consisting of N-methylmorpholine, imidazole, 1-methylimidazole, 1-benzylimidazole, 2-imidazoline, 3-imidazoline, 2-dimethylamino-1-ethanol, and 4-ethylpyridine.

7. A process as set forth in claim 2, wherein the polar organic solvent is selected from the group consisting of ethylene glycol, propylene glycol, glycerin, ethylene glycol monomethyl ether, ethylene glycol monoethyl ether, ethylene glycol monopropyl ether, ethylene glycol monobutyl ether, and propylene glycol monomethyl ether.

8. A process as set forth in claim 1, comprising depositing copper in a concavity in a surface of the base structure, wherein the concavity comprises one or more of a through silicon via, a submicron via or trench, or a through hole in a semiconductor assembly or printed circuit board.

9. A process as set forth in claim 1, wherein the conductive layer is selected from the group consisting of a copper seed layer, a conductive polymer layer and an under bump metal pad.

10. A process as set forth in claim 1, wherein the electrolytic deposition composition further comprises an accelerator.

11. A process as set forth in claim 1, wherein said aqueous electrolytic composition contains:
   $Cu^{++}$ ions in a concentration between about 5 and about 80 g/L;
   an acid selected from the group consisting of sulfuric acid and an alkanesulfonic acid in a concentration between about 5 and about 80 g/L;
   an accelerator in a concentration between about 1 and about 100 mg/L; and
   a suppressor in a concentration up to 4000 mg/L.

12. A process as set forth in claim 11, wherein the concentration of said quaternized polyepihalohydrin in said electrolytic composition is between 1 and about 100 mg/L.

13. A process as set forth in claim 1, wherein:
   an electrolytic circuit is established comprising the metalizing substrate comprising the conductive layer on a surface of the dielectric or semiconductor, an anode, the aqueous electrolytic composition in contact with said conductive layer and said anode, and a power source having a positive terminal in electrical communication with the anode and a negative terminal in electrical communication with the conductive layer; and
   a current is passed through said circuit to deposit copper, wherein copper is electrodeposited on the seminal conductive layer at an average current density between about 1 and about 25 amps/dm² integrated over the metalizing substrate.

14. A process as set forth in claim 1, wherein the epihalohydrin comprises epichlorohydrin.

15. A process as set forth in claim 5, wherein the polymeric moiety of structure (I) is bonded to a residual hydroxyl oxygen of an alcohol.

16. A composition for use in electrodeposition of copper for electrodeposition of copper on a dielectric or semiconductor base structure, the composition comprising:
   $Cu^{+}$ ions;
   an acid selected from the group consisting of sulfuric acid and an alkylsulfonic acid;
   a suppressor;
   a polar organic solvent characterized by a boiling point (neat) of at least 120° C.; and
   a quatemized poly(epihalohydrin) comprising n repeating units corresponding to structure IN and p repeating units corresponding to structure IP:

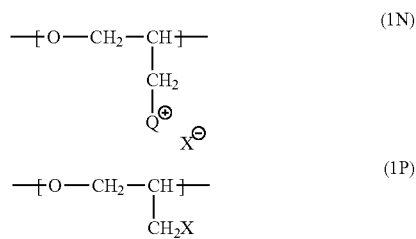

wherein Q has a structure corresponding to a substituted or unsubstituted nitrogen-containing heteroaryl compound; n is an integer between 3 and 35, p is an integer between 0 and 25; and wherein n/(n+p)<1; X is a halo substituent; and X– is a monovalent anion, and wherein Q is

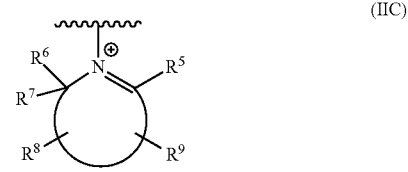

wherein structure IIC is a heterocyclic moiety and each of $R^5$, $R^6$, $R^7$, $R^8$ and $R^9$ is independently selected from the group consisting of hydrogen, substituted or unsubstituted alkyl, substituted or unsubstituted alkenyl, substituted or unsubstituted alkynyl, substituted or unsubstituted aralkyl, substituted or unsubstituted alicyclic, and substituted or unsubstituted aryl, and substituted or unsubstituted heterocyclic.

17. A composition as set forth in claim 16, wherein the quaternized poly(epihalohydrin) comprises additional repeating units comprising residues of at least one alkylene oxide.

18. A composition as set forth in claim 17, wherein the residues of alkylene oxide are selected from the group consisting of ethylene oxide, propylene oxide, butylene oxide, 3,4-epoxy-1-butanol, 2,3-epoxy-1-propanol, glycidol, and combinations of one or more of the foregoing.

19. A composition as set forth in claim 16, wherein the poly(epihalohydrin) consists essentially of repeating units that are residues of epihalohydrin and repeating units that are residues of quaternized epihalohydrin corresponding to Structure (I):

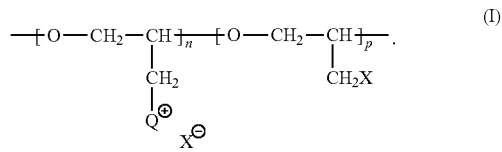

20. A composition as set forth in claim 16, wherein the tertiary amine is selected from the group consisting of N-methylmorpholine, imidazole, 1-benzylimidazole, 2-imidazoline, 3-imidazoline, N,N-dimethylbenzyldimethylamine, 3-dimethylamine-1-propanol, 2dimethylamino-1-ethanol, 4-ethylpyridine, and 1-methylimidazole.

21. A composition as set forth in claim 16, wherein Q corresponds to the structure that may be obtained by reacting a pendent methylene chloride group of poly(epihalohydrin)

with a tertiary amine selected from the group consisting of N-methylmorpholine, imidazole, 1-benzylimidazole, 2-imidazoline, 3-imidazoline, 4-ethylpyridine, 2-dimethylamino-1-ethanol, and 1-methylimidazole.

22. A composition as set forth in claim 16, wherein the polar organic solvent is selected from the group consisting of ethylene glycol, propylene glycol, glycerin, ethylene glycol monomethyl ether, ethylene glycol monoethyl ether, ethylene glycol monopropyl ether, ethylene glycol monobutyl ether, and propylene glycol monomethyl ether.

23. A process for formulating an electrodeposition composition for electrodeposition of copper on a dielectric or semiconductor substrate, the process comprising combining in an aqueous medium a source of copper ions, an acid, a suppressor and a solution of a quaternized poly(epihalohydrin), the solution of poly(epihalohydrin) comprising a polar organic solvent characterized by a boiling point (neat) of at least about 120° C., the quaternized poly(epihalohydrin) comprising n repeating units corresponding to the structure IN and p repeating units corresponding to the structure IP:

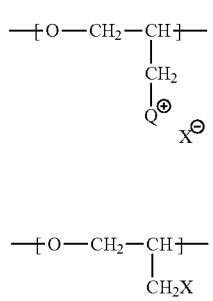

(1N)

(1P)

wherein Q has a structure corresponding to a substituted or unsubstituted nitrogen-containing heteroaryl compound; n is an integer between 3 and 35, p is an integer between 0 and 25; and wherein n/(n+p)<1; X is a halo substituent; and X– is a monovalent anion, and wherein Q is

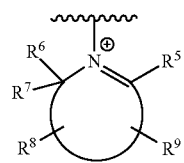

(IIC)

wherein structure IIC is a heterocyclic moiety and each of $R^5$, $R^6$, $R^7$, $R^8$ and $R^9$ is independently selected from the group consisting of hydrogen, substituted or unsubstituted alkyl, substituted or unsubstituted alkenyl, substituted or unsubstituted alkynyl, substituted or unsubstituted aralkyl, substituted or unsubstituted alicyclic, and substituted or unsubstituted aryl, and substituted or unsubstituted heterocyclic.

24. A process as set forth in claim 23, wherein the quaternized poly(epihalohydrin) comprises additional repeating units comprising residues of at least one alkylene oxide.

25. A process as set forth in claim 24, wherein the residues of alkylene oxide are selected from the group consisting of ethylene oxide, propylene oxide, butylene oxide, 3,4-epoxy-1-butanol, 2,3-epoxy-1-propanol, glycidol, and combinations of one or more of the foregoing.

26. A process as set forth in claim 23, wherein the poly(epihalohydrin) consists essentially of repeating units that are residues of epihalohydrin and repeating units that are residues of quaternized epihalohydrin

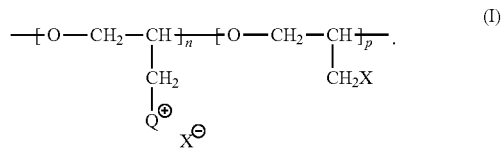

(I)

27. A process as set forth in claim 23, wherein the solution of quaternized poly(epihalohydrin) comprising a polar organic solvent is prepared by a process comprising reacting poly(epihalohydrin) in said polar organic solvent with a tertiary amine.

28. A process as set forth in claim 23, wherein the electrodeposition composition further comprises an accelerator.

* * * * *